(12) United States Patent
Kim et al.

(10) Patent No.: US 10,901,926 B2
(45) Date of Patent: Jan. 26, 2021

(54) SEMICONDUCTOR DEVICE

(71) Applicant: SK hynix Inc., Icheon-si (KR)

(72) Inventors: Woongrae Kim, Icheon-si (KR); Young Jun Yoon, Hwaseong-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 16/400,249

(22) Filed: May 1, 2019

(65) Prior Publication Data

US 2020/0142847 A1 May 7, 2020

(30) Foreign Application Priority Data

Nov. 2, 2018 (KR) .......................... 10-2018-0133611

(51) Int. Cl.
  *G06F 13/28* (2006.01)
  *G11C 11/408* (2006.01)
  *G11C 11/4076* (2006.01)
  *G11C 11/4096* (2006.01)

(52) U.S. Cl.
  CPC .......... *G06F 13/28* (2013.01); *G11C 11/4076* (2013.01); *G11C 11/4082* (2013.01); *G11C 11/4096* (2013.01)

(58) Field of Classification Search
  USPC .............. 365/233.18; 710/35; 711/150, 169
  See application file for complete search history.

(56) References Cited

U.S. PATENT DOCUMENTS

| 9,721,633 | B2 | 8/2017 | Shimizu | |
|---|---|---|---|---|
| 2004/0047230 | A1* | 3/2004 | Mizuhashi | G11C 7/1072 365/233.1 |
| 2005/0078548 | A1* | 4/2005 | Kang | G11C 7/1045 365/232 |
| 2014/0032812 | A1* | 1/2014 | Ong | G11C 13/0002 711/102 |
| 2019/0205051 | A1* | 7/2019 | Choi | G11C 7/1018 |

FOREIGN PATENT DOCUMENTS

KR 1020150075840 A 7/2015

* cited by examiner

*Primary Examiner* — Ilwoo Park
(74) *Attorney, Agent, or Firm* — William Park & Associates Ltd.

(57) ABSTRACT

A semiconductor device includes a burst control circuit configured to generate burst information depending on a logic level of a setting bit when an operation setting signal is inputted and configured to generate a burst control signal from the burst information in the case where a read signal is inputted. The semiconductor device also includes a data processing circuit configured to output output data by performing first and second burst operations for internal data, depending on a logic level of the burst control signal.

23 Claims, 16 Drawing Sheets

FIG. 2

| OPERATION | ICLK EDGE | CS | CA<1> | CA<2> | CA<3> | CA<4> | CA<5> | CA<6> | CA<7> |
|---|---|---|---|---|---|---|---|---|---|
| CAS | Rising | H | L | L | H | H | X | X | L |
| CAS | Falling | X | X | X | X | X | X | X | H or L |
| ERT | Rising | H | H | L | X | X | X | X | X |
| ERT | Falling | X | X | X | X | X | X | X | X |

SEMICONDUCTOR DEVICE

CROSS-REFERENCE TO RELATED APPLICATION

The present application claims priority under 35 U.S.C. § 119(a) to Korean Patent Application No. 10-2018-0133611 filed on Nov. 2, 2018, in the Korean Intellectual Property Office, which is incorporated herein by reference in its entirety.

BACKGROUND

1. Technical Field

Embodiments of the present disclosure relate to a semiconductor device which performs a read operation with a set burst operation.

2. Related Art

In general, a semiconductor device, such as a DRAM, includes a plurality of bank groups which are configured with cell arrays to be accessed by the same addresses. Each bank group may include a plurality of banks. The semiconductor device performs a column operation of selecting one bank group among the plurality of bank groups and outputting data stored in the cell array included in the selected bank group by loading the data on input/output lines.

SUMMARY

In an embodiment, a semiconductor device may include a burst control circuit configured to generate burst information depending on a logic level of a setting bit when an operation setting signal is inputted, and configured to generate a burst control signal from the burst information when a read signal is inputted. The semiconductor device may further include a data processing circuit configured to output output data by performing first and second burst operations for internal data, depending on a logic level of the burst control signal.

In an embodiment, a semiconductor device may include a command decoder configured to generate an operation setting signal and then generate a read signal depending on a combination of command addresses in synchronization with an internal clock and an inverted internal clock. The semiconductor device may also include a burst control circuit configured to generate a burst control signal from a setting bit depending on the operation setting signal and the read signal. The semiconductor device may additionally include a data processing circuit configured to output output data by performing first and second burst operations for internal data, depending on a logic level of the burst control signal.

BRIEF DESCRIPTION OF THE DRAWINGS

FIG. 2 shows a table to assist in the explanation of the logic levels of command addresses for controlling the operation of the semiconductor device shown in FIG. 1, in accordance with an embodiment.

DETAILED DESCRIPTION

Hereinafter, a semiconductor device is described below with reference to the accompanying drawings through various examples of embodiments. Some embodiments, for example, are directed to a semiconductor device which sets a burst operation before a read operation and performs the read operation with the set burst operation.

According to embodiments, by setting a burst operation before a read operation and performing the read operation with the set burst operation, it is possible to anticipate an effect that an additional time for setting a burst operation may be reduced.

Also, according to embodiments, by setting a burst operation before a read operation and performing the read operation with the set burst operation, because it is not necessary to input an additional command for setting the burst operation, loss in command input efficiency may be reduced or prevented.

In a semiconductor device, a bank group mode, an 8-bank mode and a 16-bank mode may be provided. Each bank group may include a plurality of banks. For example, each bank group may include 4 banks. In the bank group mode, a column operation for one bank included in a bank group may be performed by one command. In the 8-bank mode, column operations for two banks included in each bank group may be sequentially performed by one command. In the 16-bank mode, column operations for four banks included in each bank group may be sequentially performed by one command.

Figure 1:
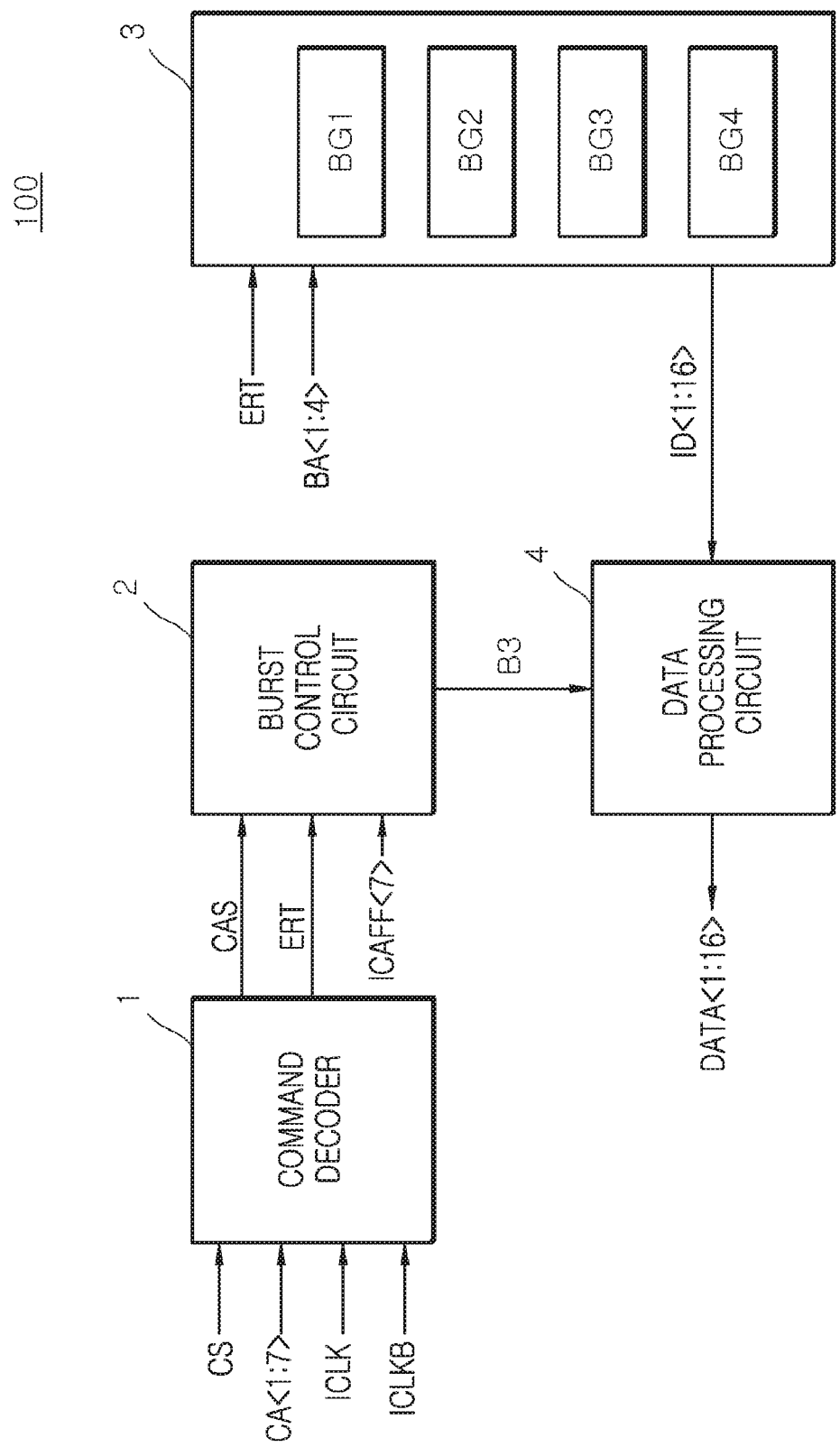
FIG. 1 shows a block diagram illustrating a configuration of a semiconductor device, in accordance with an embodiment.

As shown in FIG. 1, a semiconductor device 100, in accordance with an embodiment, may include a command decoder 1, a burst control circuit 2, a core circuit 3, and a data processing circuit 4.

The command decoder 1 may generate an operation setting signal CAS and then generate a read signal ERT, depending on a chip select signal CS and first to seventh command addresses CA<1:7> in synchronization with an internal clock ICLK and an inverted internal clock ICLKB. The command decoder 1 may generate the operation setting signal CAS in the case where the chip select signal CS is enabled and the logic level combination of the first to seventh command addresses CA<1:7> is a first combination in synchronization with the internal clock ICLK and the inverted internal clock ICLKB. The command decoder 1 may generate the read signal ERT in the case where the chip select signal CS is enabled and the logic level combination of the first to seventh command addresses CA<1:7> is a second combination in synchronization with the internal clock ICLK and the inverted internal clock ICLKB. The operation setting signal CAS may be set as a signal which is enabled to enter a setting mode for setting a burst operation of the semiconductor device. The read signal ERT may be set as a signal which is enabled to enter a read operation for outputting data DATA<1:16> (also referred to as output data) by the set burst operation. The read signal ERT may be generated after one cycle period of the internal clock ICLK from a time when the operation setting signal CAS is generated. While seven bits are indicted for the command addresses CA<1:7>, different embodiments may have different numbers of bits. The logic levels of the first combination and the second combination of the first to seventh command addresses CA<1:7> are described in detail below with reference to FIG. 2.

The burst control circuit 2 may generate a burst control signal B3 from a setting bit ICAFF<7> depending on the operation setting signal CAS and the read signal ERT. The burst control circuit 2 may generate burst information BI (see FIG. 4) from the setting bit ICAFF<7> in the case where the operation setting signal CAS is inputted. The burst control circuit 2 may generate the burst control signal B3 from the burst information BI (see FIG. 4) in the case where the read signal ERT is inputted. The setting bit ICAFF<7> may be generated from the seventh command address CA<7> which is inputted in synchronization with the inverted internal clock ICLKB. The setting bit ICAFF<7> may be set as a signal for generating the burst control signal B3. A setting bit for generating the burst control signal B3 may be set by any one among the first to sixth command addresses CA<1:6>, depending on an embodiment.

The core circuit 3 may include a first bank group BG1, a second bank group BG2, a third bank group BG3, and a fourth bank group BG4. Each of the first bank group BG1, the second bank group BG2, the third bank group BG3, and the fourth bank group BG4 may include a plurality of banks (not shown). The core circuit 3 may output internal data ID<1:16> which are stored in the first bank group BG1, the second bank group BG2, the third bank group BG3, and the fourth bank group BG4 selected by first to fourth bank addresses BA<1:4>, in the case where the read signal ERT is inputted. While sixteen bits are indicated for the internal data ID<1:16> outputted from the core circuit 3, different embodiments may have different numbers of bits. From the core circuit 3, by one read signal ERT, the first to sixteenth internal data ID<1:16> may be outputted and then the first to sixteenth internal data ID<1:16> may be successively outputted again. In the core circuit 3, in an 8-bank mode, column operations for two banks included in each of the first to fourth bank groups BG1 to BG4 may be sequentially performed by one read signal ERT. In the core circuit 3, in a 16-bank mode, column operations for four banks included in each of the first to fourth bank groups BG1 to BG4 may be sequentially performed by one read signal ERT.

The data processing circuit 4 may perform first and second burst operations for the first to sixteenth internal data ID<1:16>, depending on the logic level of the burst control signal B3, and thereby, may output first to sixteenth output data DATA<1:16>. The data processing circuit 4 may output the first to sixteenth output data DATA<1:16> without changing the sequence of the bits of the first to sixteenth internal data ID<1:16>, in the case of performing the first burst operation depending on the logic level of the burst control signal B3. The data processing circuit 4 may output the first to sixteenth output data DATA<1:16> by changing the sequence of the bits of the first to sixteenth internal data ID<1:16>, in the case of performing the second burst operation depending on the logic level of the burst control signal B3. The data processing circuit 4 may output the first to eighth internal data ID<1:8> as the ninth to sixteenth output data DATA<9:16> and output the ninth to sixteenth internal data ID<9:16> as the first to eighth output data DATA<1:8>, in the case of performing the second burst operation depending on the logic level of the burst control signal B3.

The logic levels of command addresses for controlling the operation of the semiconductor device in accordance with the embodiment are described below with reference to FIG. 2.

First, the logic levels of the chip select signal CS and the first to seventh command addresses CA<1:7> for generating the operation setting signal CAS are described below.

The command decoder 1 may generate the operation setting signal CAS in the case where the chip select signal CS is enabled to a logic high level and the logic level combination of the first to seventh command addresses CA<1:7> is the first combination in synchronization with the rising edge of the internal clock ICLK. The first combination of the first to seventh command addresses CA<1:7> is set to a case where the first command address CA<1> is at a logic low level, the second command address CA<2> is at a logic low level, the third command address CA<3> is at a logic high level, the fourth command address CA<4> is at a logic high level, and the seventh command address CA<7> is at a logic low level. The fifth command address CA<5> and the sixth command address CA<6> may be handled as "don't care" (independent of the first combination), and information, such as an address, may be inputted through the fifth command address CA<5> and the sixth command address CA<6>.

Next, the logic levels of the chip select signal CS and the first to seventh command addresses CA<1:7> for generating the read signal ERT are described below.

The command decoder 1 may generate the read signal ERT in the case where the chip select signal CS is enabled to the logic high level and the logic level combination of the first to seventh command addresses CA<1:7> is the second combination in synchronization with the rising edge of the internal clock ICLK. The second combination of the first to seventh command addresses CA<1:7> is set to a case where the first command address CA<1> is at a logic high level and the second command address CA<2> is at the logic low level. The third command address CA<3>, the fourth command address CA<4>, the fifth command address CA<5>, the sixth command address CA<6>, and the seventh command address CA<7> may be handled as "don't care" (independent of the second combination), and an information, such as an address, may be inputted through the third command address CA<3>, the fourth command address CA<4>, the fifth command address CA<5>, the sixth command address CA<6>, and the seventh command address CA<7>.

In succession, the setting bit ICAFF<7> for generating the burst control signal B3 is described below.

The burst control circuit 2 generates the burst information BI (see FIG. 4) from the setting bit ICAFF<7> in the case where the operation setting signal CAS is inputted, and then, generates the burst control signal B3 from the burst information BI (see FIG. 4) in the case where the read signal ERT is inputted. In the case where the seventh command address CA<7> inputted at the falling edge of the internal clock ICLK is at the logic low level, the setting bit ICAFF<7> is generated at a logic low level. The falling edge of the internal clock ICLK is synchronized with the rising edge of the inverted internal clock ICLKB. In the case where the setting bit ICAFF<7> is at the logic low level, the setting bit ICAFF<7> is set as a logic level for performing the first burst operation for outputting the first to sixteenth output data DATA<1:16> without changing the sequence of the bits of the first to sixteenth internal data ID<1:16>. In the case where the seventh command address CA<7> inputted at the falling edge of the internal clock ICLK is at a logic high level, the setting bit ICAFF<7> is generated at a logic high level. In the case where the setting bit ICAFF<7> is at the logic high level, the setting bit ICAFF<7> is set as a logic level for performing the second burst operation for outputting the first to sixteenth output data DATA<1:16> by changing the sequence of the bits of the first to sixteenth internal data ID<1:16>.

Figure 3:
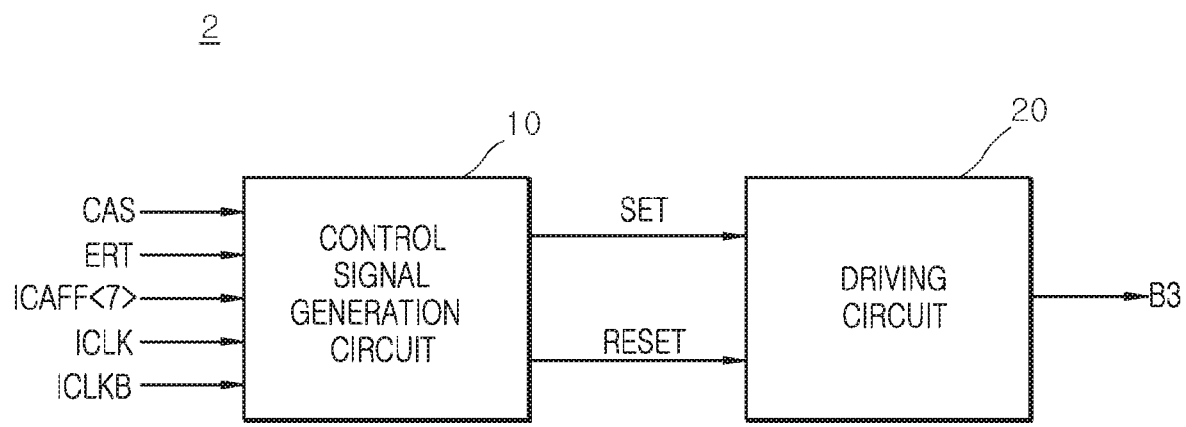
FIG. 3 shows a block diagram illustrating a configuration of the burst control circuit included in the semiconductor device shown in FIG. 1.

Referring to FIG. 3, the burst control circuit 2 may include a control signal generation circuit 10 and a driving circuit 20.

The control signal generation circuit 10 may latch the operation setting signal CAS and the setting bit ICAFF<7> in synchronization with the internal clock ICLK and the inverted internal clock ICLKB. The control signal generation circuit 10 may generate a setting control signal SET and a reset control signal RESET from the latched operation setting signal CAS and setting bit ICAFF<7> in the case where the read signal ERT is inputted. The control signal generation circuit 10 may latch the operation setting signal CAS and may generate the setting control signal SET and the reset control signal RESET from the operation setting signal CAS and the setting bit ICAFF<7> after one cycle period of the internal clock ICLK. The reset control signal RESET may be enabled after two cycles of the inverted internal clock ICLKB after the setting control signal SET is enabled.

The driving circuit 20 may generate the burst control signal B3 for which an enable period is set depending on the setting control signal SET and the reset control signal RESET. The driving circuit 20 may generate the burst control signal B3 which is enabled in the case where the setting control signal SET is enabled. The driving circuit 20 may generate the burst control signal B3 which is disabled in the case where the reset control signal RESET is enabled.

Figure 4:
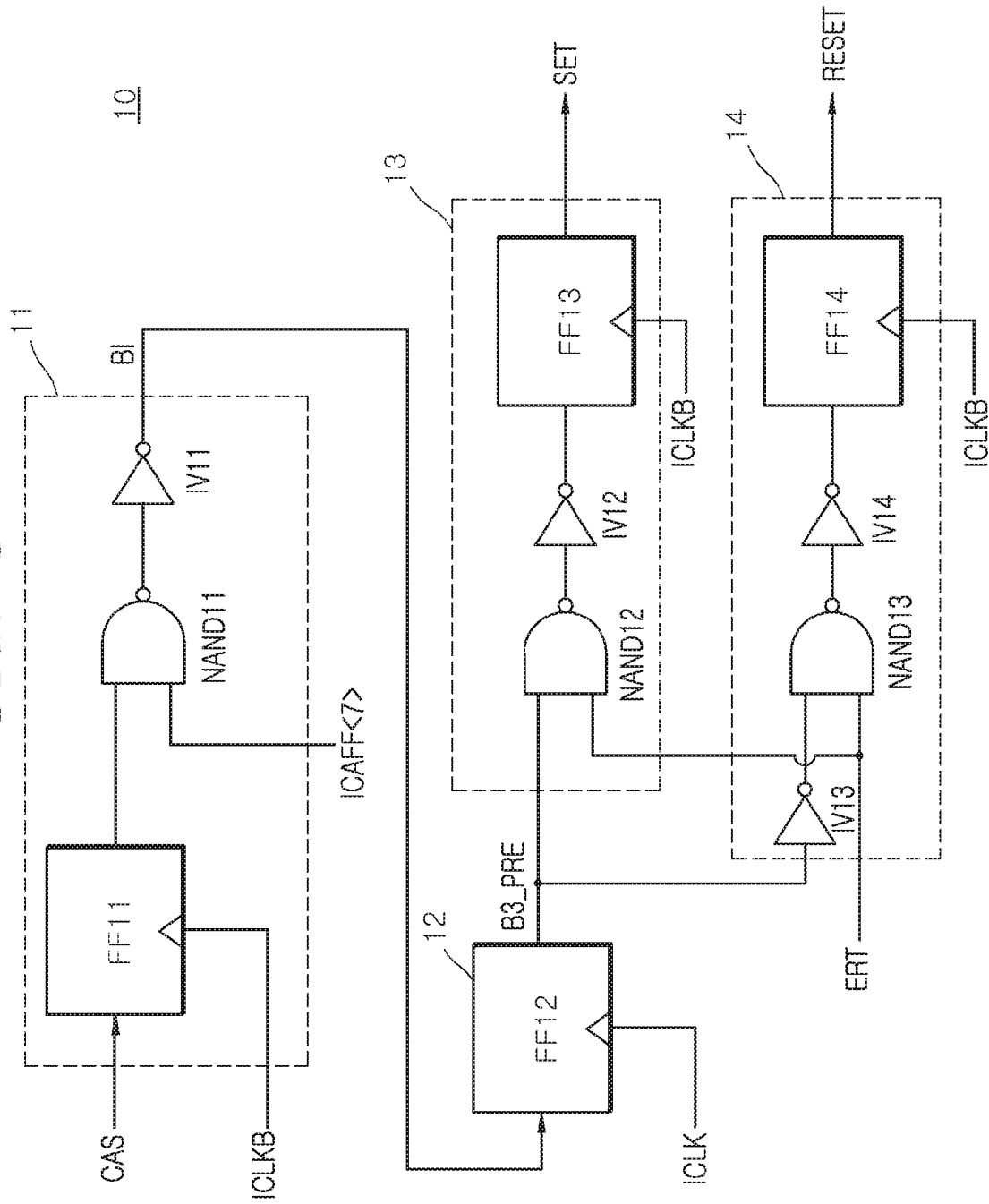
FIG. 4 shows a circuit diagram illustrating a configuration of the control signal generation circuit included in the burst control circuit shown in FIG. 3.

Referring to FIG. 4, the control signal generation circuit 10 may include a burst information generation circuit 11, a pre-burst control signal generation circuit 12, a setting control signal generation circuit 13, and a reset control signal generation circuit 14.

The burst information generation circuit 11 may include a flip-flop FF11, a NAND gate NAND11, and an inverter IV11. The burst information generation circuit 11 may generate the burst information BI from the setting bit ICAFF<7> in the case where the operation setting signal CAS is enabled in synchronization with the inverted internal clock ICLKB. The burst information generation circuit 11 may generate the burst information BI of a logic high level in the case where the operation setting signal CAS is inputted at a logic high level and the setting bit ICAFF<7> is at the logic high level during a period in which the inverted internal clock ICLKB is at a logic high level. The burst information generation circuit 11 may generate the burst information BI of a logic low level in the case where the operation setting signal CAS is inputted at the logic high level and the setting bit ICAFF<7> is the logic low level during a period in which the inverted internal clock ICLKB is at the logic high level.

The pre-burst control signal generation circuit 12 may include a flip-flop FF12. The pre-burst control signal generation circuit 12 may latch the burst information BI in synchronization with the internal clock ICLK and thereby generate a pre-burst control signal B3_PRE. The pre-burst control signal generation circuit 12 may generate the pre-burst control signal B3_PRE of a logic high level in the case where the burst information BI is at the logic high level during a period in which the internal clock ICLK is at the logic high level. The pre-burst control signal generation circuit 12 may generate the pre-burst control signal B3_PRE of a logic low level in the case where the burst information BI is at the logic low level during a period in which the internal clock ICLK is at the logic high level.

The setting control signal generation circuit 13 may include a NAND gate NAND12, an inverter IV12, and a flip-flop FF13. The setting control signal generation circuit 13 may buffer the pre-burst control signal B3_PRE and thereby generate the setting control signal SET, in the case where the read signal ERT is enabled to a logic high level during a period in which the inverted internal clock ICLKB is at the logic high level.

The reset control signal generation circuit 14 may include inverters IV13 and IV14, a NAND gate NAND13, and a flip-flop FF14. The reset control signal generation circuit 14 may invert and buffer the pre-burst control signal B3_PRE and thereby generate the reset control signal RESET, in the case where the read signal ERT is enabled to the logic high level during a period in which the inverted internal clock ICLKB is at the logic high level. The reset control signal RESET may be set as a signal which is enabled after one cycle of the inverted internal clock ICLKB after the setting control signal SET is enabled.

Figure 5:
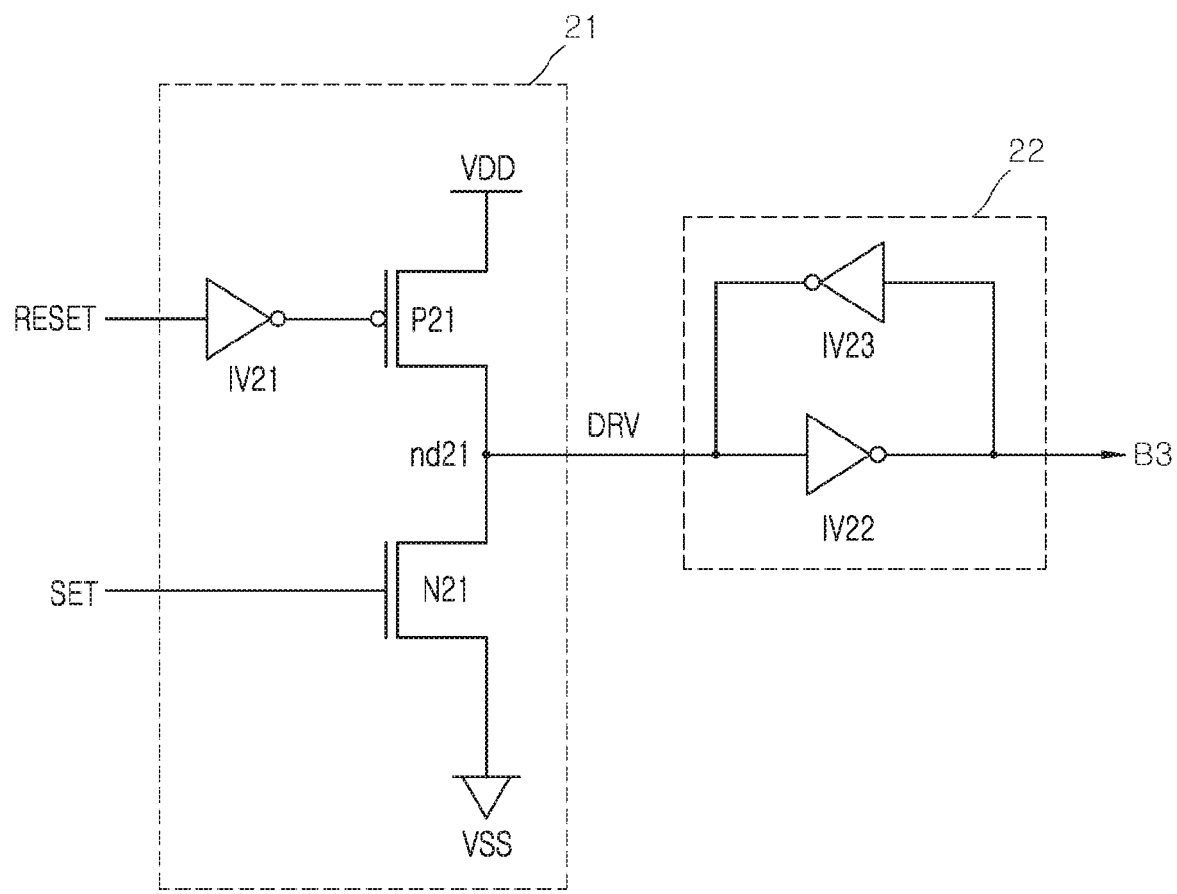
FIG. 5 shows a circuit diagram illustrating a configuration of the driving circuit included in the burst control circuit shown in FIG. 3.

Referring to FIG. 5, the driving circuit 20 may include a driving signal generation circuit 21 and a buffer circuit 22.

The driving signal generation circuit 21 may include an inverter IV21, a PMOS transistor P21, and an NMOS transistor N21. The inverter IV21 may invert and buffer the reset control signal RESET and output an output signal. The PMOS transistor P21 may be positioned between a power supply voltage VDD and a node nd21. The PMOS transistor P21 may be turned on in the case where the output signal of the inverter IV21 is at a logic low level, drive the node nd21 with the power supply voltage VDD, and generate a driving signal DRV of a logic high level. The NMOS transistor N21 may be positioned between the node nd21 and a ground voltage VSS. The NMOS transistor N21 may be turned on in the case where the setting control signal SET is at a logic high level, drive the node nd21 with the ground voltage VSS, and generate the driving signal DRV of a logic low level. That is to say, the driving signal generation circuit 21 may generate the driving signal DRV of the logic high level in the case where the reset control signal RESET is at a logic high level. The driving signal generation circuit 21 may generate the driving signal DRV of the logic low level in the case where the setting control signal SET is at the logic high level.

The buffer circuit 22 may include inverters IV22 and IV23. The inverter IV22 may invert and buffer the driving signal DRV and generate the burst control signal B3. The inverters IV22 and IV23 may latch the burst control signal B3.

Figure 6:
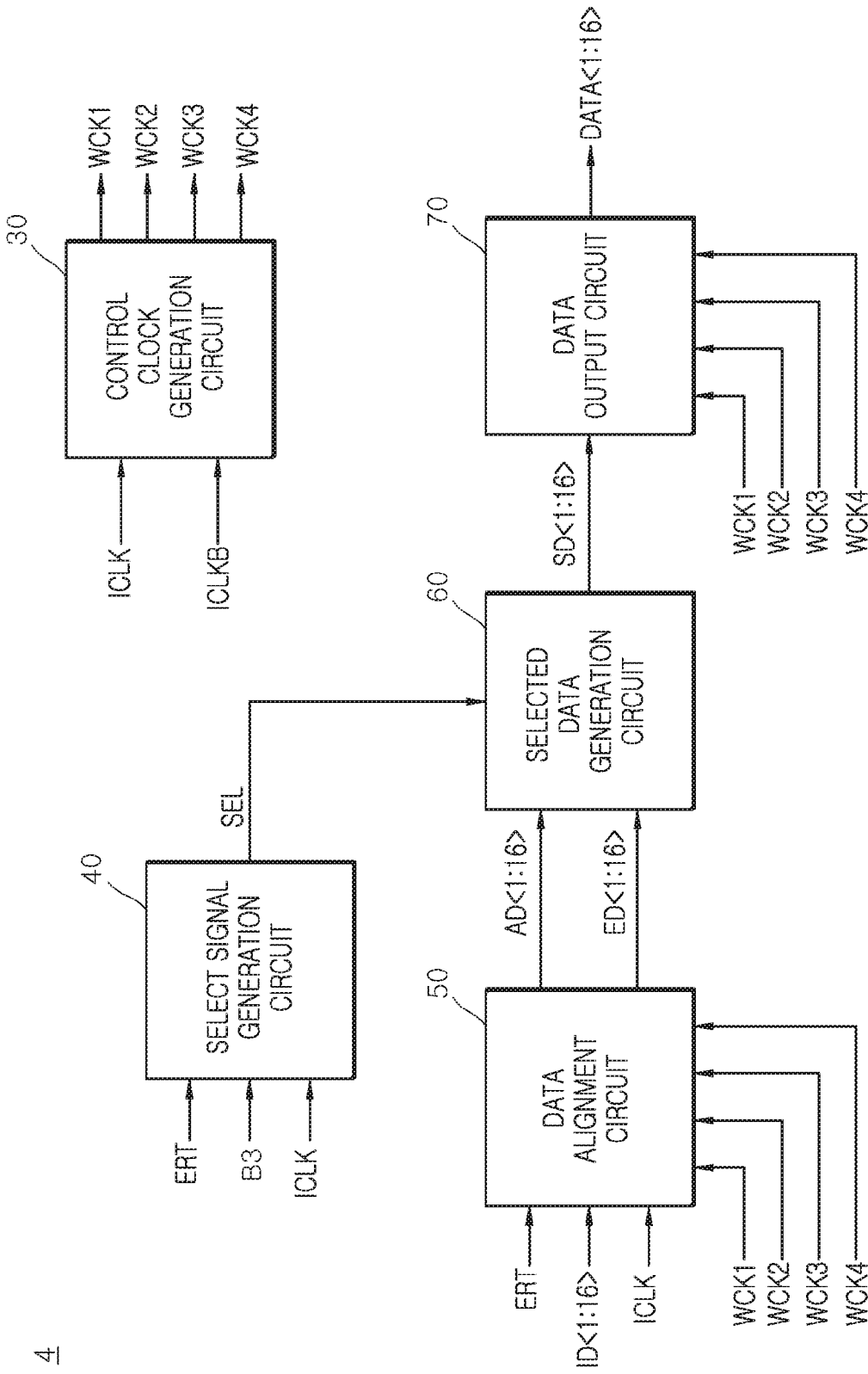
FIG. 6 shows a block diagram illustrating a configuration of the data processing circuit included in the semiconductor device shown in FIG. 1.

Referring to FIG. 6, the data processing circuit 4 may include a control dock generation circuit 30, a select signal generation circuit 40, a data alignment circuit 50, a selected data generation circuit 60, and a data output circuit 70.

The control clock generation circuit 30 may receive the internal clock ICLK and the inverted internal clock ICLKB and generate a first control clock WCK1, a second control clock WCK2, a third control clock WCK3, and a fourth control clock WCK4 which have different phases. The first control clock WCK1 may be generated to have the same phase as the internal clock ICLK. The third control clock WCK3 may be generated to have the same phase as the inverted internal clock ICLKB.

The select signal generation circuit 40 may generate a select signal SEL from the burst control signal B3 in the case where the read signal ERT is inputted in synchronization with the internal clock ICLK. The select signal generation circuit 40 may latch the burst control signal B3 at a time when the read signal ERT is inputted in synchronization with the internal clock ICLK, The select signal generation circuit 40 may generate the select signal SEL from the latched burst control signal B3 after a predetermined period from the time when the read signal ERT is inputted in synchronization with the internal clock ICLK.

The data alignment circuit 50 may latch the first to sixteenth internal data ID<1:16> in synchronization with the internal dock ICLK in the case where the read signal ERT is inputted. The data alignment circuit 50 may output the latched first to sixteenth internal data ID<1:16> as first to sixteenth aligned data AD<1:16> in synchronization with the first control clock WCK1, the second control clock WCK2, the third control clock WCK3, and the fourth control clock WCK4. The data alignment circuit 50 may output the latched first to sixteenth internal data ID<1:16> as first to sixteenth converted data ED<1:16> in synchronization with the first control clock WCK1, the second control clock WCK2, the third control clock WCK3, and the fourth control clock WCK4.

The selected data generation circuit 60 may output the first to sixteenth aligned data AD<1:16> or the first to sixteenth converted data ED<1:16> as first to sixteenth selected data SD<1:16>, depending on the select signal SEL. The selected data generation circuit 60 may output the first to sixteenth aligned data AD<1:16> as the first to sixteenth selected data SD<1:16> in the case where the select signal SEL is disabled. The selected data generation circuit 60 may output the first to sixteenth converted data ED<1:16> as the first to sixteenth selected data SD<1:16> in the case where the select signal SEL is enabled.

The data output circuit 70 may output the first to sixteenth selected data SD<1:16> as the first to sixteenth output data DATA<1:16> in synchronization with the first control clock WCK1, the second control dock WCK2, the third control clock WCK3, and the fourth control clock WCK4.

Figure 7:
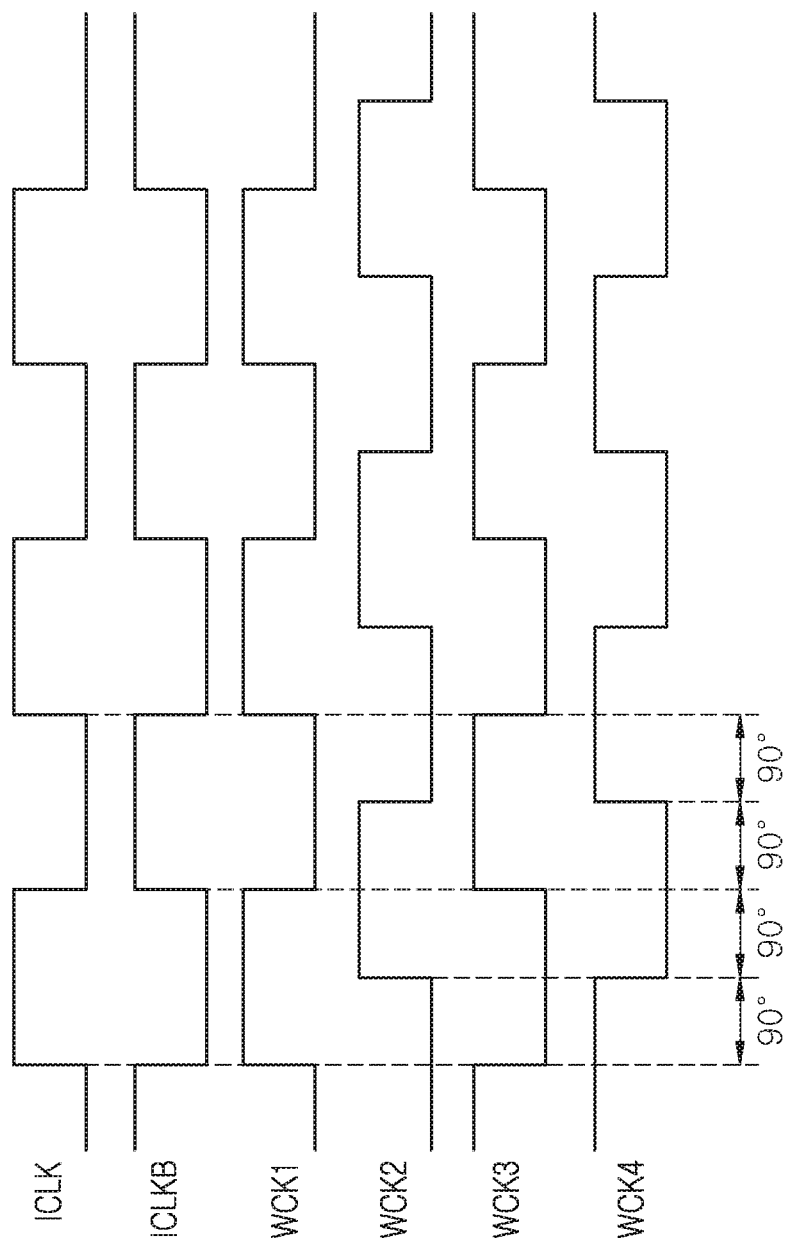
FIG. 7 shows a timing diagram to assist in the explanation of the phase differences of an internal clock, an inverted internal clock, and first to fourth control clocks.

The phase differences among the internal dock ICLK, the inverted internal clock ICLKB, the first control clock WCK1, the second control clock WCK2, the third control clock WCK3, and the fourth control clock WCK4 are described below with reference to FIG. 7.

The inverted internal clock ICLKB is generated to have a phase opposite to the internal clock ICLK. The first control clock WCK1 is generated to have the same phase as the internal clock ICLK. The second control clock WCK2 is generated to have a phase difference of 90 degrees from the first control clock WCK1. The third control clock WCK3 is generated to have the same phase as the inverted internal clock ICLKB. The third control clock WCK3 is generated to have a phase difference of 90 degrees from the second control clock WCK2. The fourth control clock WCK4 is generated to have a phase difference of 90 degrees from the third control clock WCK3.

Figure 8:
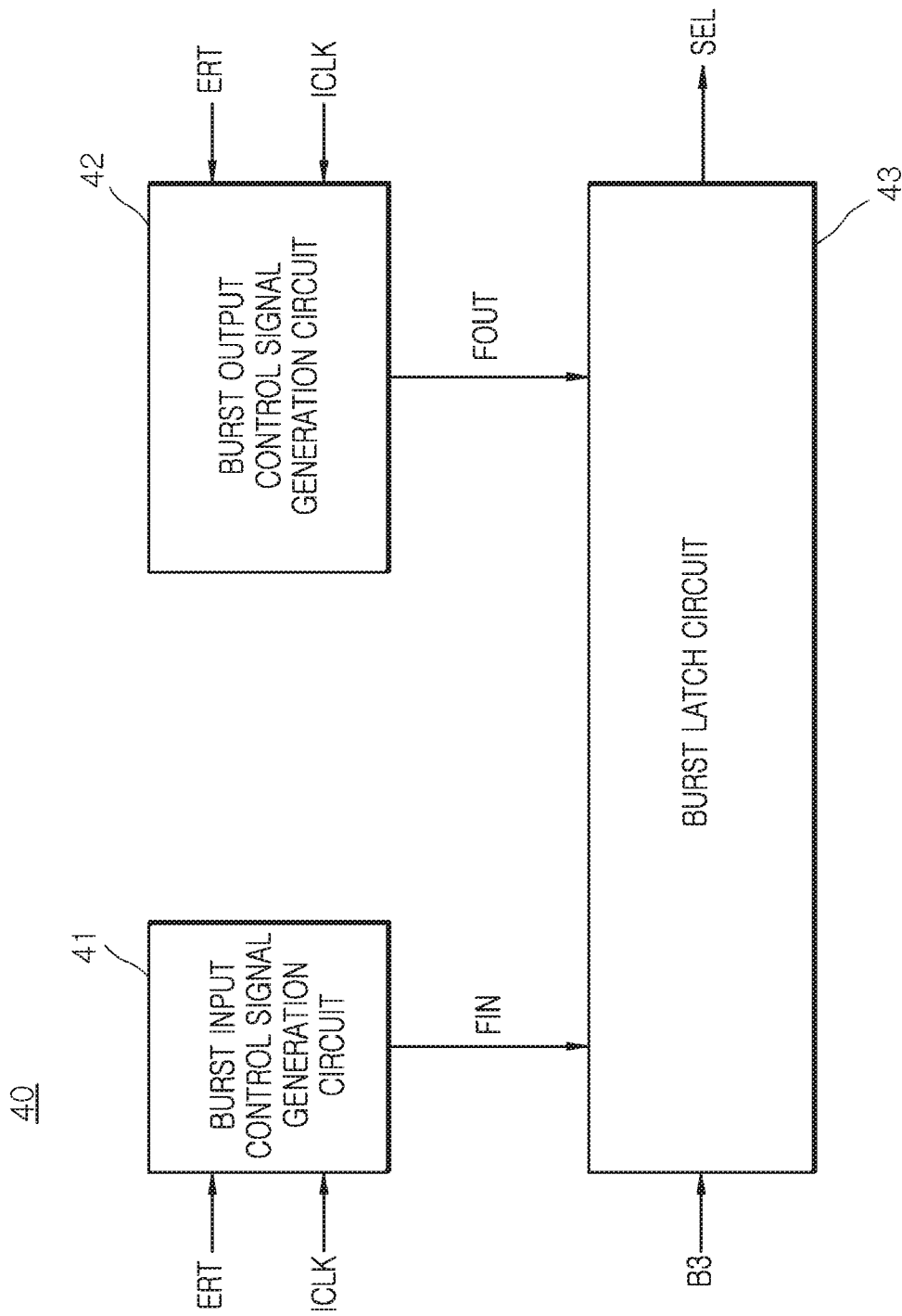
FIG. 8 shows a block diagram illustrating a configuration of the select signal generation circuit included in the data processing circuit shown in FIG. 6.

Referring to FIG. 8, the selected signal generation circuit 40 may include a burst input control signal generation circuit 41, a burst output control signal generation circuit 42, and a burst latch circuit 43.

The burst input control signal generation circuit 41 may generate a burst input control signal FIN from the read signal ERT in synchronization with the internal clock ICLK. The burst input control signal generation circuit 41 may generate the burst input control signal FIN which is enabled in the case where the read signal ERT is inputted in synchronization with the rising edge of the internal clock ICLK.

The burst output control signal generation circuit 42 may generate a burst output control signal FOUT by shifting the read signal ERT. The burst output control signal generation circuit 42 may generate the burst output control signal FOUT by shifting the read signal ERT by a preset number of times by which the internal clock ICLK toggles. The preset number of times by which the internal clock ICLK toggles may be set variously depending on a burst length. The burst length means the number of bits of data inputted/outputted in each of the first and second burst operations.

The burst latch circuit 43 may latch the burst control signal B3 at a time when the burst input control signal FIN is inputted. The burst latch circuit 43 may output the latched burst control signal B3 as the select signal SEL at a time when the burst output control signal FOUT is inputted.

Figure 9:
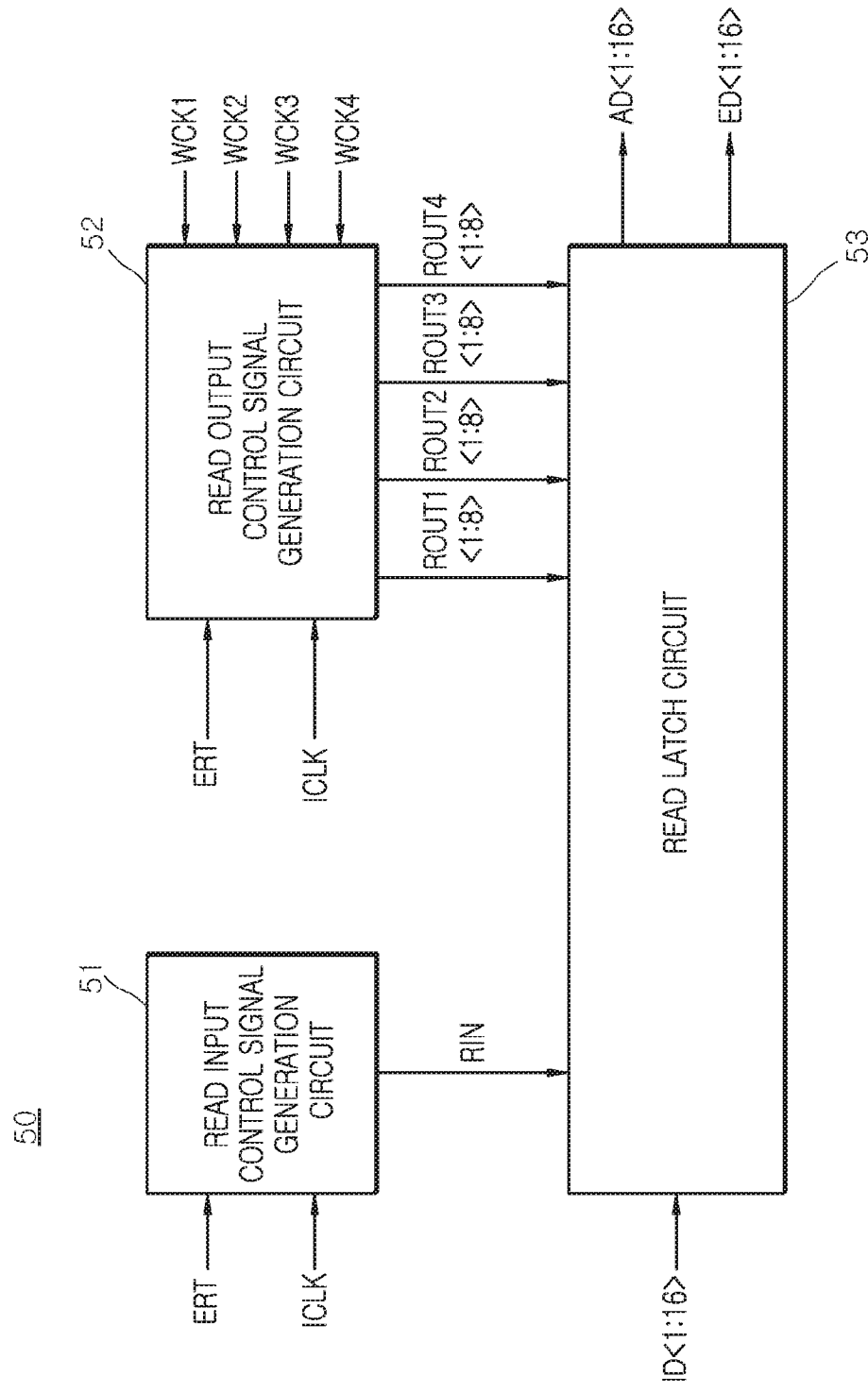
FIG. 9 shows a block diagram illustrating a configuration of the data alignment circuit included in the data processing circuit shown in FIG. 6.

Referring to FIG. 9, the data alignment circuit 50 may include a read input control signal generation circuit 51, a read output control signal generation circuit 52, and a read latch circuit 53.

The read input control signal generation circuit 51 may generate a read input control signal RIN from the read signal ERT in synchronization with the internal clock ICLK. The read input control signal generation circuit 51 may generate the read input control signal RIN which is enabled in the case where the read signal ERT is inputted in synchronization with the rising edge of the internal clock ICLK.

The read output control signal generation circuit 52 may shift the read signal ERT in synchronization with the internal clock ICLK, and may generate first read output control signals ROUT1<1:8> from the shifted read signal ERT in synchronization with the first control clock WCK1. The read output control signal generation circuit 52 may shift the read signal ERT in synchronization with the internal clock ICLK, and may generate second read output control signals ROUT2<1:8> from the shifted read signal ERT in synchronization with the second control clock WCK2. The read output control signal generation circuit 52 may shift the read signal ERT in synchronization with the internal clock ICLK, and may generate third read output control signals ROUT3<1:8> from the shifted read signal ERT in synchronization with the third control clock WCK3. The read output control signal generation circuit 52 may shift the read signal ERT in synchronization with the internal clock ICLK, and may generate fourth read output control signals ROUT4<1:8> from the shifted read signal ERT in synchronization with the fourth control clock WCK4.

The read latch circuit 53 may latch the first to sixteenth internal data ID<1:16> at a time when the read input control signal RIN is inputted.

The read latch circuit 53 may output the first to sixteenth internal data ID<1:16> as the first to sixteenth aligned data AD<1:16> and may change the sequence of the first to sixteenth internal data ID<1:16> and output the first to sixteenth converted data ED<1:16>, at a time when the first read output control signals ROUT1<1:8>, the second read output control signals ROUT2<1:8>, the third read output control signals ROUT3<1:8>, and the fourth read output control signals ROUT4<1:8> are inputted.

Figure 10:
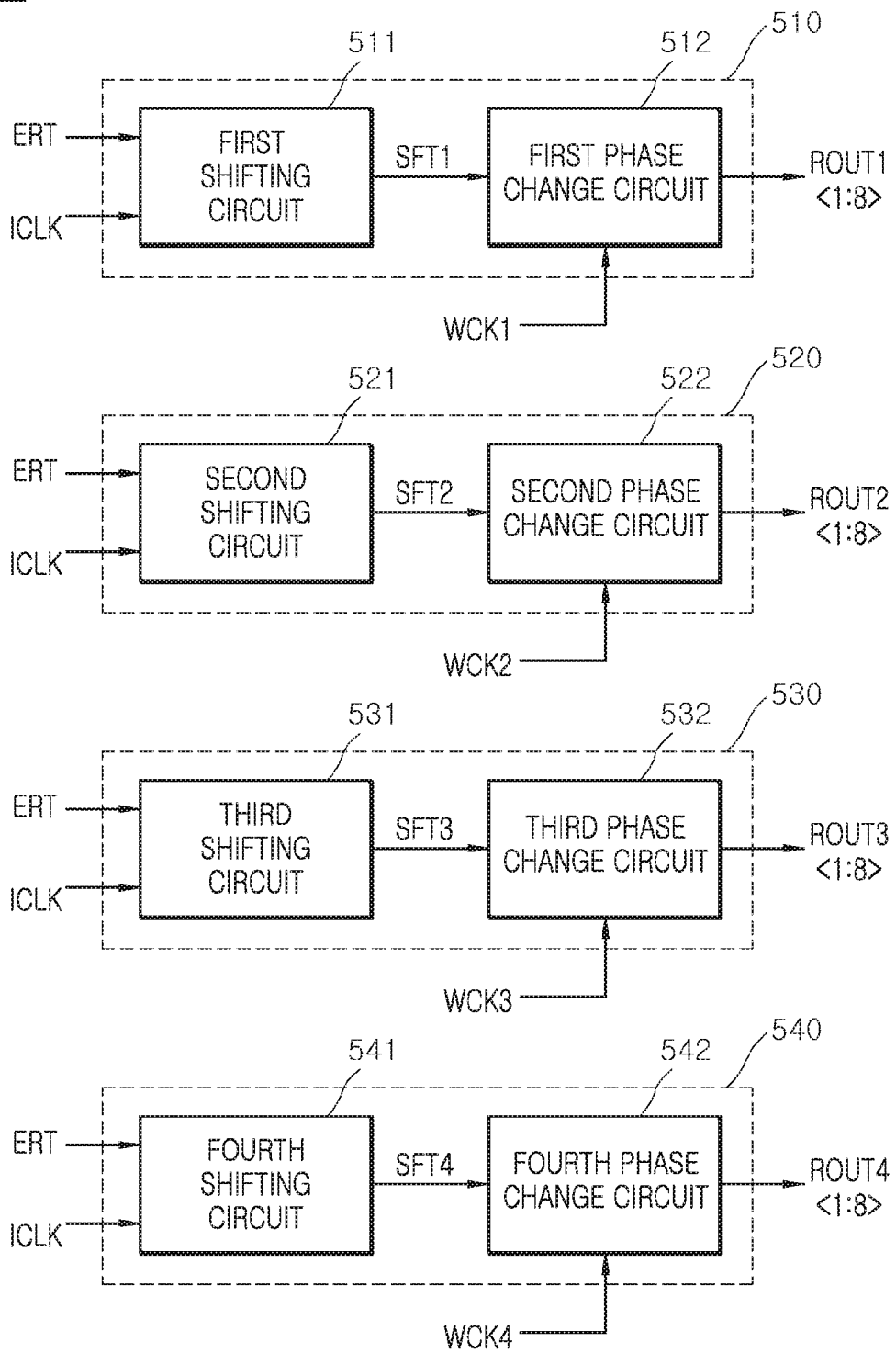
FIG. 10 shows a block diagram illustrating a configuration of the read output control signal generation circuit included in the data alignment circuit shown in FIG. 9.

Referring to FIG. 10, the read output control signal generation circuit 52 may include a first read output control signal generation circuit 510, a second read output control signal generation circuit 520, a third read output control signal generation circuit 530, and a fourth read output control signal generation circuit 540.

The first read output control signal generation circuit 510 may include a first shifting circuit 511 and a first phase change circuit 512. The first shifting circuit 511 may generate a first shifting signal SFT1 by shifting the read signal ERT in synchronization with the internal clock ICLK. A time for shifting the read signal ERT may be set differently for different embodiments. The first phase change circuit 512 may generate the first read output control signals ROUT1<1:8> from the first shifting signal SFT1 in synchronization with the first control dock WCK1.

The second read output control signal generation circuit 520 may include a second shifting circuit 521 and a second phase change circuit 522. The second shifting circuit 521 may generate a second shifting signal SFT2 by shifting the read signal ERT in synchronization with the internal clock ICLK. A time for shifting the read signal ERT may be set differently for different embodiments. The second phase change circuit 522 may generate the second read output control signals ROUT2<1:8> from the second shifting signal SFT2 in synchronization with the second control clock WCK2.

The third read output control signal generation circuit 530 may include a third shifting circuit 531 and a third phase change circuit 532. The third shifting circuit 531 may generate a third shifting signal SFT3 by shifting the read signal ERT in synchronization with the internal clock ICLK. A time for shifting the read signal ERT may be set differently for different embodiments. The third phase change circuit 532 may generate the third read output control signals ROUT3<1:8> from the third shifting signal SFT3 in synchronization with the third control clock WCK3.

The fourth read output control signal generation circuit 540 may include a fourth shifting circuit 541 and a fourth phase change circuit 542. The fourth shifting circuit 541 may generate a fourth shifting signal SFT4 by shifting the read signal ERT in synchronization with the internal clock ICLK. A time for shifting the read signal ERT may be set differently for different embodiments. The fourth phase change circuit 542 may generate the fourth read output control signals ROUT4<1:8> from the fourth shifting signal SFT4 in synchronization with the fourth control clock WCK4.

Figure 11:
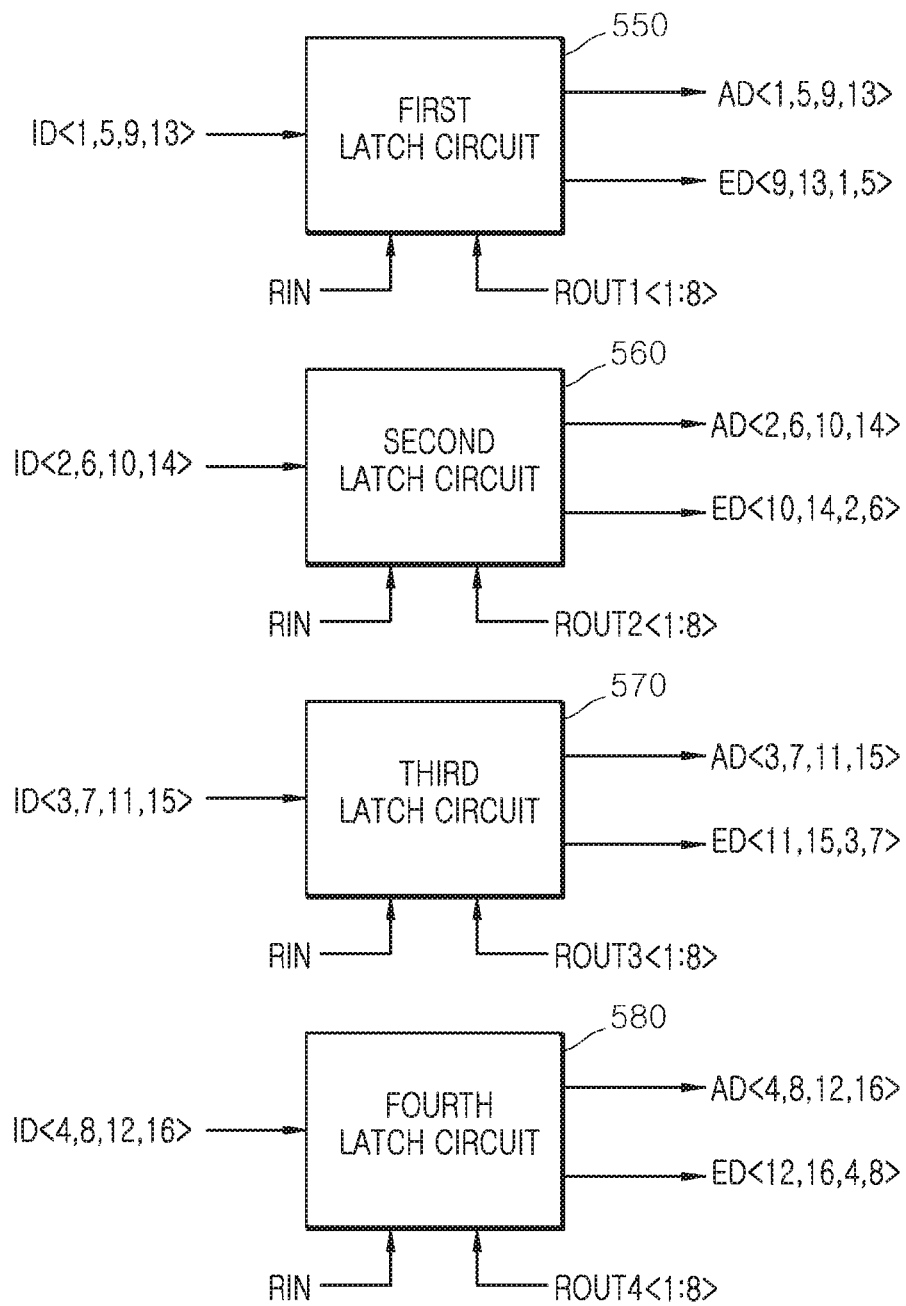
FIG. 11 shows a block diagram illustrating a configuration of the read latch circuit included in the data alignment circuit shown in FIG. 9.

Referring to FIG. 11, the read latch circuit 53 may include a first latch circuit 550, a second latch circuit 560, a third latch circuit 570, and a fourth latch circuit 580.

The first latch circuit 550 may latch the first internal data ID<1>, the fifth internal data ID<5>, the ninth internal data ID<9>, and the thirteenth internal data ID<13> at a time when the read input control signal RIN is inputted.

The first latch circuit 550 may output the latched first internal data ID<1> as the first aligned data AD<1> at a time when the first bit ROUT1<1> of the first read output control signals ROUT1<1:8> is inputted. The first latch circuit 550 may output the latched fifth internal data ID<5> as the fifth aligned data AD<5> at a time when the second bit ROUT1<2> of the first read output control signals ROUT1<1:8> is inputted. The first latch circuit 550 may output the latched ninth internal data ID<9> as the ninth aligned data AD<9> at a time when the third bit ROUT1<3> of the first read output control signals ROUT1<1:8> is inputted. The first latch circuit 550 may output the latched thirteenth internal data ID<13> as the thirteenth aligned data AD<13> at a time when the fourth bit ROUT1<4> of the first read output control signals ROUT1<1:8 is inputted.

The first latch circuit 550 may output the latched ninth internal data ID<9> as the first converted data ED<1> at a time when the fifth bit ROUT1<5> of the first read output control signals ROUT1<1:8> is inputted. The first latch circuit 550 may output the latched thirteenth internal data ID<13> as the fifth converted data ED<5> at a time when the sixth bit ROUT1<6> of the first read output control signals ROUT1<1:8> is inputted. The first latch circuit 550 may output the latched first internal data ID<1> as the ninth converted data ED<9> at a time when the seventh bit ROUT1<7> of the first read output control signals ROUT1<1:8> is inputted. The first latch circuit 550 may output the latched fifth internal data ID<5> as the thirteenth converted data ED<13> at a time when the eighth bit ROUT1<8> of the first read output control signals ROUT1<1:8> is inputted.

The second latch circuit 560 may latch the second internal data ID<2>, the sixth internal data ID<6>, the tenth internal data ID<10>, and the fourteenth internal data ID<14> at a time when the read input control signal RIN is inputted.

The second latch circuit 560 may output the latched second internal data ID<2> as the second aligned data AD<2> at a time when the first bit ROUT2<1> of the second read output control signals ROUT2<1:8> is inputted. The second latch circuit 560 may output the latched sixth internal data ID<6> as the sixth aligned data AD<6> at a time when the second bit ROUT2<2> of the second read output control signals ROUT2<1:8> is inputted. The second latch circuit 560 may output the latched tenth internal data ID<10> as the tenth aligned data AD<10> at a time when the third bit ROUT2<3> of the second read output control signals ROUT2<1:8> is inputted. The second latch circuit 560 may output the latched fourteenth internal data ID<14> as the fourteenth aligned data AD<14> at a time when the fourth bit ROUT2<4> of the second read output control signals ROUT2<1:8> is inputted.

The second latch circuit 560 may output the latched tenth internal data ID<10> as the second converted data ED<2> at a time when the fifth bit ROUT2<5> of the second read output control signals ROUT2<1:8> is inputted. The second latch circuit 560 may output the latched fourteenth internal data ID<14> as the sixth converted data ED<6> at a time when the sixth bit ROUT2<6> of the second read output control signals ROUT2<1:8> is inputted. The second latch circuit 560 may output the latched second internal data ID<2> as the tenth converted data ED<10> at a time when the seventh bit ROUT2<7> of the second read output control signals ROUT2<1:8> is inputted. The second latch circuit 560 may output the latched sixth internal data ID<6> as the fourteenth converted data ED<14> at a time when the eighth bit ROUT2<8> of the second read output control signals ROUT2<1:8> is inputted.

The third latch circuit 570 may latch the third internal data ID<3>, the seventh internal data ID<7>, the eleventh internal data ID<11>, and the fifteenth internal data ID<15> at a time when the read input control signal RIN is inputted.

The third latch circuit 570 may output the latched third internal data ID<3> as the third aligned data AD<3> at a time when the first bit ROUT3<1> of the third read output control signals ROUT3<1:8> is inputted. The third latch circuit 570 may output the latched seventh internal data ID<7> as the seventh aligned data AD<7> at a time when the second bit ROUT3<2> of the third read output control signals ROUT3<1:8> is inputted. The third latch circuit 570 may output the latched eleventh internal data ID<11> as the eleventh aligned data AD<11> at a time when the third bit ROUT3<3> of the third read output control signals ROUT3<1:8> is inputted. The third latch circuit 570 may output the latched fifteenth internal data ID<15> as the fifteenth aligned data AD<15> at a time when the fourth bit ROUT3<4> of the third read output control signals ROUT3<1:8> is inputted.

The third latch circuit 570 may output the latched eleventh internal data ID<11> as the third converted data ED<3> at a time when the fifth bit ROUT3<5> of the third read output control signals ROUT3<1:8> is inputted. The third latch circuit 570 may output the latched fifteenth internal data ID<15> as the seventh converted data ED<7> at a time when the sixth bit ROUT3<6> of the third read output control signals ROUT3<1:8> is inputted. The third latch circuit 570 may output the latched third internal data ID<3> as the eleventh converted data ED<11> at a time when the seventh bit ROUT3<7> of the third read output control signals ROUT3<1:8> is inputted. The third latch circuit 570 may output the latched seventh internal data ID<7> as the fifteenth converted data ED<15> at a time when the eighth bit ROUT3<8> of the third read output control signals ROUT3<1:8> is inputted.

The fourth latch circuit 580 may latch the fourth internal data ID<4>, the eighth internal data ID<8>, the twelfth internal data ID<12>, and the sixteenth internal data ID<16> at a time when the read input control signal RIN is inputted.

The fourth latch circuit 580 may output the latched fourth internal data ID<4> as the fourth aligned data AD<4> at a time when the first bit ROUT4<1> of the fourth read output control signals ROUT4<1:8> is inputted. The fourth latch circuit 580 may output the latched eighth internal data ID<8> as the eighth aligned data AD<8> at a time when the second bit ROUT4<2> of the fourth read output control signals ROUT4<1:8> is inputted. The fourth latch circuit 580 may output the latched twelfth internal data ID<12> as the twelfth aligned data AD<12> at a time when the third bit ROUT4<3> of the fourth read output control signals ROUT4<1:8> is inputted. The fourth latch circuit 580 may output the latched sixteenth internal data ID<16> as the sixteenth aligned data AD<16> at a time when the fourth bit ROUT4<4> of the fourth read output control signals ROUT4<1:8> is inputted.

The fourth latch circuit 580 may output the latched twelfth internal data ID<12> as the fourth converted data ED<4> at a time when the fifth bit ROUT4<5> of the fourth read output control signals ROUT4<1:8> is inputted. The fourth latch circuit 580 may output the latched sixteenth internal data ID<16> as the eighth converted data ED<8> at a time when the sixth bit ROUT4<6> of the fourth read output control signals ROUT4<1:8> is inputted. The fourth latch circuit 580 may output the latched fourth internal data ID<4> as the twelfth converted data ED<12> at a time when the seventh bit ROUT4<7> of the fourth read output control signals ROUT4<1:8> is inputted. The fourth latch circuit 580 may output the latched eighth internal data ID<8> as the sixteenth converted data ED<16> at a time when the eighth bit ROUT4<8> of the fourth read output control signals ROUT4<1:8> is inputted.

Figure 12:
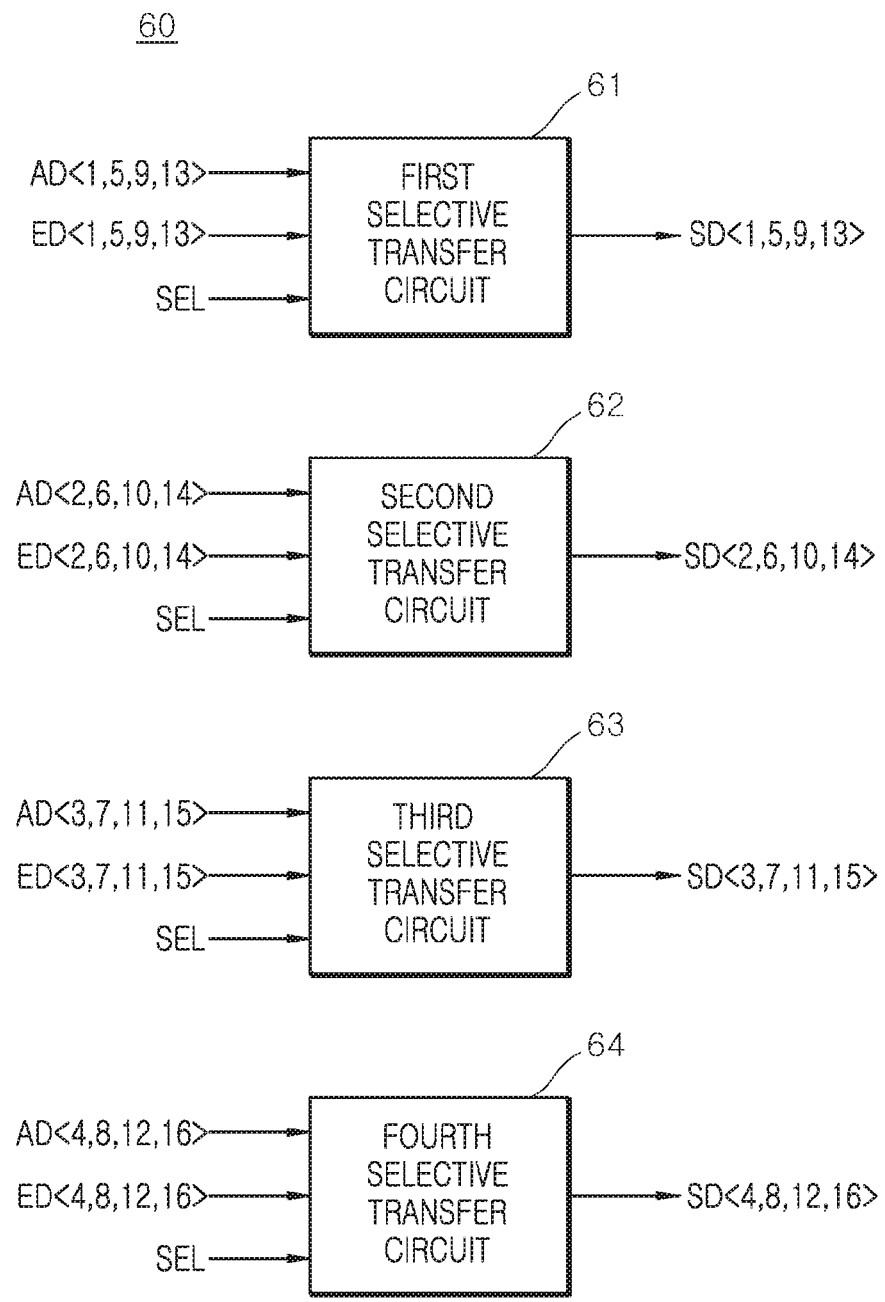
FIG. 12 shows a block diagram illustrating a configuration of the selected data generation circuit included in the data processing circuit shown in FIG. 6.

Referring to FIG. 12, the selected data generation circuit 60 may include a first selective transfer circuit 61, a second selective transfer circuit 62, a third selective transfer circuit 63, and a fourth selective transfer circuit 64.

The first to fourth selective transfer circuits 61, 62, 63, and 64 may output the first to sixteenth aligned data AD<1:16> as the first to sixteenth selected data SD<1:16> in the case where the select signal SEL is disabled. The first to fourth selective transfer circuits 61, 62, 63, and 64 may output the first to sixteenth converted data ED<1:16> as the first to sixteenth selected data SD<1:16> in the case where the select signal SEL is enabled.

The first selective transfer circuit 61 may output the first aligned data AD<1>, the fifth aligned data AD<5>, the ninth aligned data AD<9>, and the thirteenth aligned data AD<13> as the first selected data SD<1>, the fifth selected data SD<5>, the ninth selected data SD<9>, and the thirteenth selected data SD<13>, respectively, in the case where the select signal SEL is disabled.

The first selective transfer circuit 61 may output the first to converted data ED<1>, the fifth converted data ED<5>, the ninth converted data ED<9>, and the thirteenth converted data ED<13> as the first selected data SD<1>, the fifth selected data SD<5>, the ninth selected data SD<9>, and the thirteenth selected data SD<13>, respectively, in the case where the select signal SEL is enabled.

The second selective transfer circuit 62 may output the second aligned data AD<2>, the sixth aligned data AD<6>, the tenth aligned data AD<10>, and the fourteenth aligned data AD<14> as the second selected data SD<2>, the sixth selected data SD<6>, the tenth selected data SD<10>, and the fourteenth selected data SD<14>, respectively, in the case where the select signal SEL is disabled.

The second selective transfer circuit 62 may output the second converted data ED<2>, the sixth converted data ED<6>, the tenth converted data ED<10>, and the fourteenth converted data ED<14> as the second selected data SD<2>, the sixth selected data SD<6>, the tenth selected data SD<10>, and the fourteenth selected data SD<14>, respectively, in the case where the select signal SEL is enabled.

The third selective transfer circuit 63 may output the third aligned data AD<3>, the seventh aligned data AD<7>, the eleventh aligned data AD<11>, and the fifteenth aligned data AD<15> as the third selected data SD<3>, the seventh selected data SD<7>, the eleventh selected data SD<11>, and the fifteenth selected data SD<15>, respectively, in the case where the select signal SEL is disabled.

The third selective transfer circuit 63 may output the third converted data ED<3>, the seventh converted data ED<7>, the eleventh converted data ED<11>, and the fifteenth converted data ED<15> as the third selected data SD<3>, the seventh selected data SD<7>, the eleventh selected data SD<11>, and the fifteenth selected data SD<15>, respectively, in the case where the select signal SEL is enabled.

The fourth selective transfer circuit 64 may output the fourth aligned data AD<4>, the eighth aligned data AD<8>, the twelfth aligned data AD<12>, and the sixteenth aligned data AD<16> as the fourth selected data SD<4>, the eighth selected data SD<8>, the twelfth selected data SD<12>, and the sixteenth selected data SD<16>, respectively, in the case where the select signal SEL is disabled.

The fourth selective transfer circuit 64 may output the fourth converted data ED<4>, the eighth converted data ED<8>, the twelfth converted data ED<12>, and the sixteenth converted data ED<16> as the fourth selected data SD<4>, the eighth selected data SD<8>, the twelfth selected data SD<12>, and the sixteenth selected data SD<16>, respectively, in the case where the select signal SEL is enabled.

Figure 13:
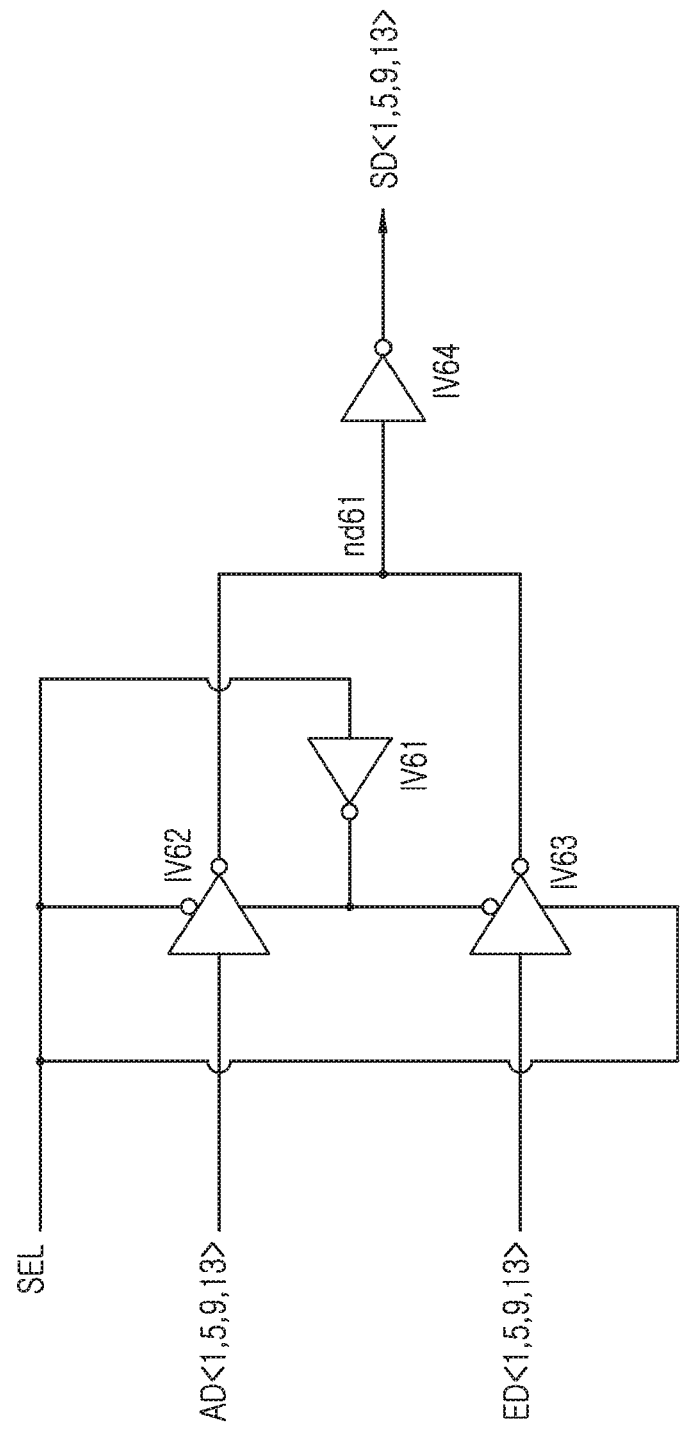
FIG. 13 shows a circuit diagram illustrating a configuration of the first selective transfer circuit included in the selected data generation circuit shown in FIG. 12.

Referring to FIG. 13, the first selective transfer circuit 61 may include inverters IV61, IV62, IV63, and IV64. The inverter IV61 inverts and buffers the select signal SEL, and outputs an output signal. The inverter IV62 may invert and buffer the first aligned data AD<1>, the fifth aligned data AD<5>, the ninth aligned data AD<9>, and the thirteenth aligned data AD<13> and output output signals to a node nd61. The inverter IV63 may invert and buffer the first converted data ED<1>, the fifth converted data ED<5>, the ninth converted data ED<9>, and the thirteenth converted data ED<13> and output output signals to the node nd61. The inverter IV64 may invert and buffer the signals of the node nd61 and generate the first selected data SD<1>, the fifth selected data SD<5>, the ninth selected data SD<9>, and the thirteenth selected data SD<13>.

The first selective transfer circuit 61 may output the first aligned data AD<1>, the fifth aligned data AD<5>, the ninth aligned data AD<9>, and the thirteenth aligned data AD<13> as the first selected data SD<1>, the fifth selected data SD<5>, the ninth selected data SD<9>, and the thirteenth selected data SD<13>, respectively, through the inverters IV62 and IV64 in the case where the select signal SEL is disabled to a logic low level.

The first selective transfer circuit 61 may output the first converted data ED<1>, the fifth converted data ED<5>, the ninth converted data ED<9>, and the thirteenth converted data ED<13> as the first selected data SD<1>, the fifth selected data SD<5>, the ninth selected data SD<9>, and the thirteenth selected data SD<13>, respectively, through the inverters IV63 and IV64 in the case where the select signal SEL is enabled to a logic high level.

Because the second to fourth selective transfer circuits 62, 63, and 64 shown in FIG. 12 are realized by the same circuit and perform the same operation as the first selective transfer circuit 61 shown in FIG. 13 except that signals to be inputted thereto and outputted therefrom are different, detailed descriptions thereof are omitted.

Figure 14:
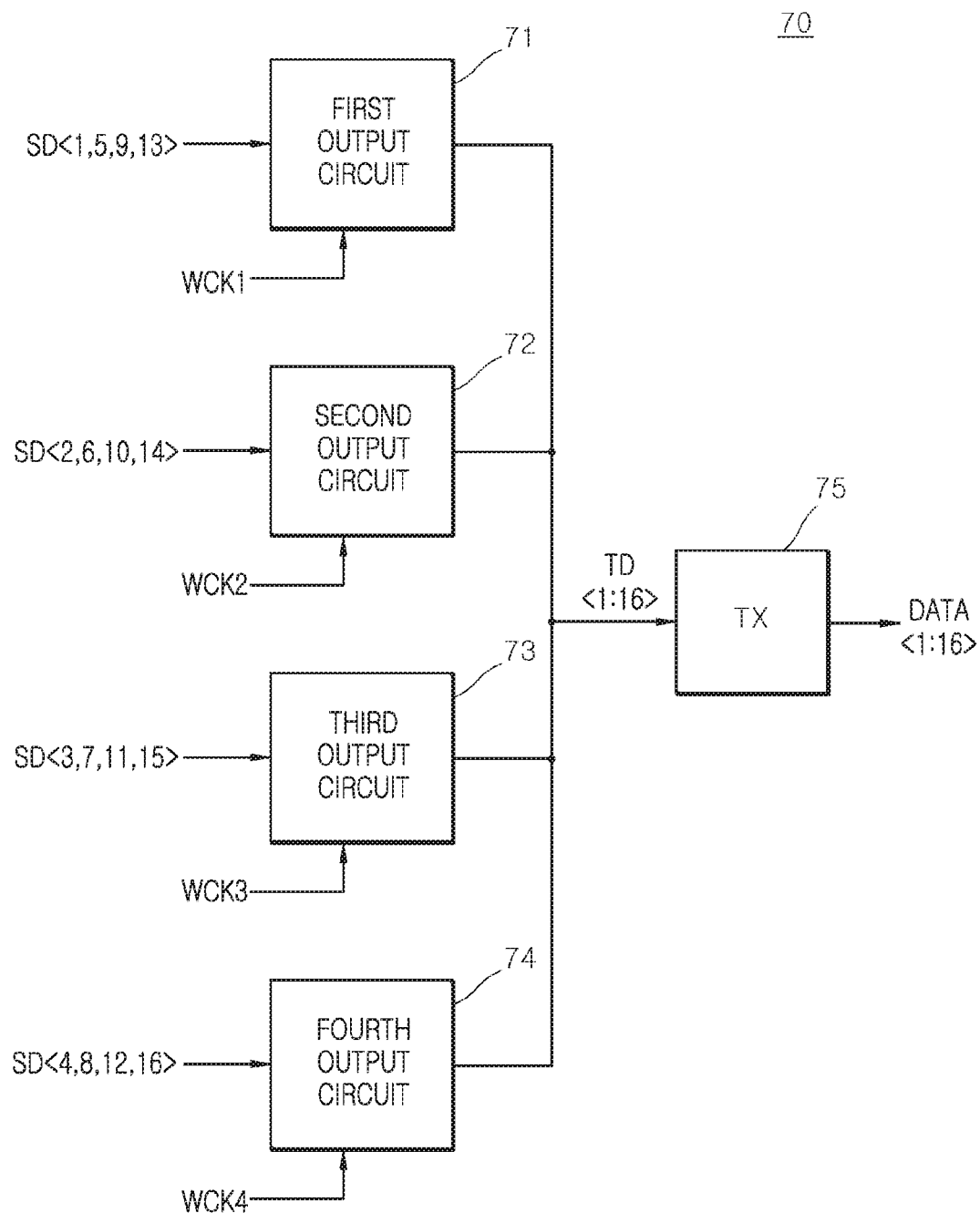
FIG. 14 shows a block diagram illustrating a configuration of the data output circuit included in the data processing circuit shown in FIG. 6.

Referring to FIG. 14, the data output circuit 70 may include a first output circuit 71, a second output circuit 72, a third output circuit 73, a fourth output circuit 74, and a transceiver 75.

The first output circuit 71 may output the first selected data SD<1>, the fifth selected data SD<5>, the ninth selected data SD<9>, and the thirteenth selected data SD<13> as first transfer data TD<1>, fifth transfer data TD<5>, ninth transfer data TD<9>, and thirteenth transfer data TD<13> in synchronization with the first control clock WCK1.

The second output circuit 72 may output the second selected data SD<2>, the sixth selected data SD<6>, the tenth selected data SD<10>, and the fourteenth selected data SD<14> as second transfer data TD<2>, sixth transfer data TD<6>, tenth transfer data TD<10>, and fourteenth transfer data TD<14> in synchronization with the second control clock WCK2.

The third output circuit 73 may output the third selected data SD<3>, the seventh selected data SD<7>, the eleventh selected data SD<11>, and the fifteenth selected data SD<15> as third transfer data TD<3>, seventh transfer data TD<7>, eleventh transfer data TD<11>, and fifteenth transfer data TD<15> in synchronization with the third control clock WCK3.

The fourth output circuit 74 may output the fourth selected data SD<4>, the eighth selected data SD<8>, the twelfth selected data SD<12>, and the sixteenth selected data SD<16> as fourth transfer data TD<4>, eighth transfer data TD<8>, twelfth transfer data TD<12>, and sixteenth transfer data TD<16> in synchronization with the fourth control clock WCK4.

The transceiver 75 may buffer the first to sixteenth transfer data TD<1:16> and output the first to sixteenth output data DATA<1:16>. The transceiver 75 may output the first to sixteenth output data DATA<1:16> to an outside.

Figure 15:
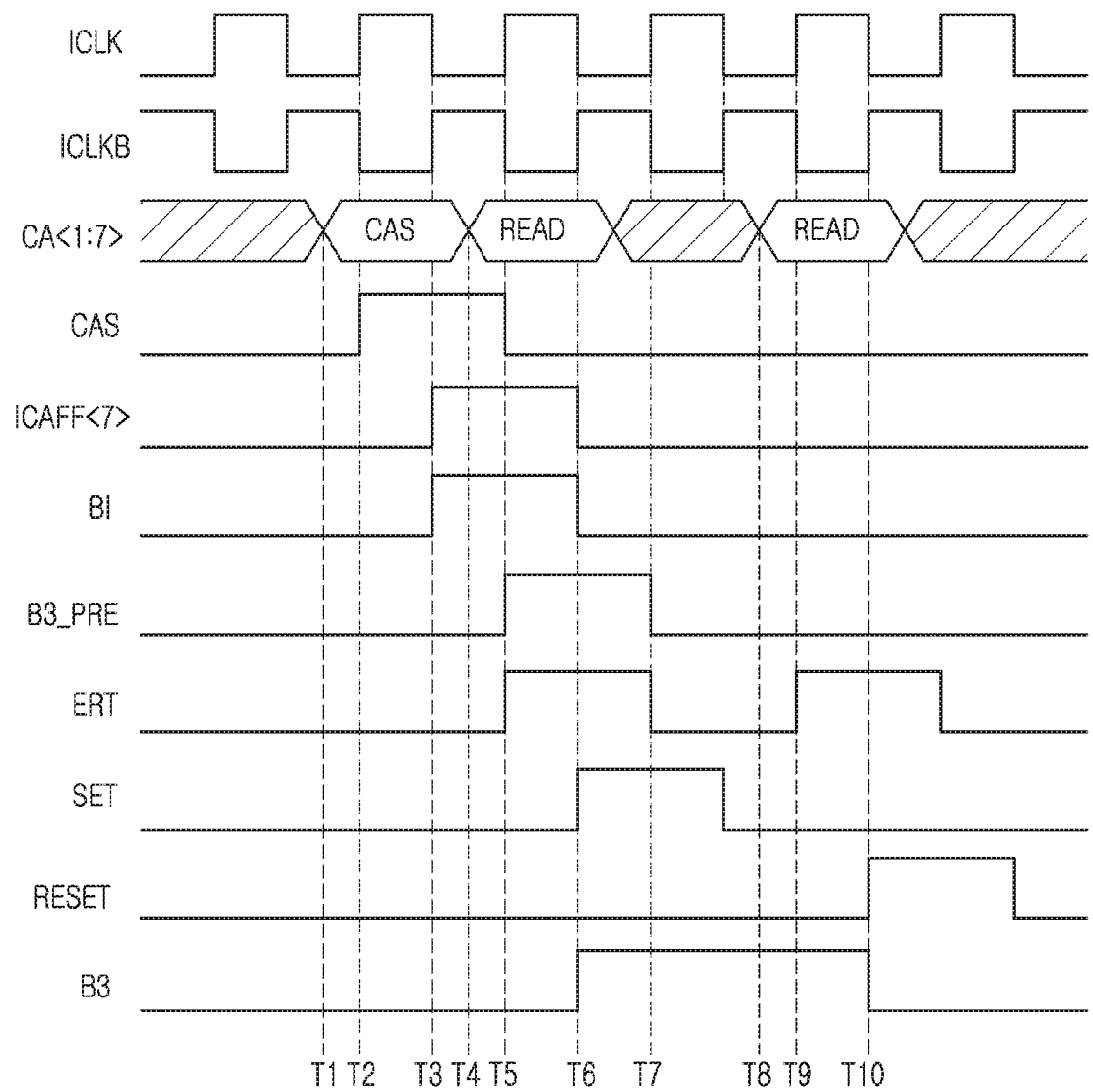
FIG. 15 shows a timing diagram to assist in the explanation of the operation of the semiconductor device in accordance with the embodiment.

A case where the semiconductor device, in accordance with the embodiment of the present disclosure, performs a successive read operation after setting a burst operation in a setting mode is described below with reference to FIG. 15.

At a time T1, the logic level combination of the first to seventh command addresses CA<1:7> is inputted as the first combination in synchronization with the rising edge of the internal clock ICLK.

At a time T2, because the chip select signal CS is enabled to the logic high level and the logic level combination of the first to seventh command addresses CA<1:7> is the first combination in synchronization with the internal clock ICLK and the inverted internal clock ICLKB, the command decoder 1 generates the operation setting signal CAS at the logic high level.

At a time T3, the setting bit ICAFF<7> is inputted at the logic high level in synchronization with the falling edge of the internal clock ICLK.

The burst information generation circuit 11 of the control signal generation circuit 10 generates the burst information BI at the logic high level because the operation setting signal CAS is at the logic high level and the setting bit ICAFF<7> is at the logic high level in synchronization with the inverted internal clock ICLKB.

At a time T4, the logic level combination of the first to seventh command addresses CA<1:7> is inputted as the second combination in synchronization with the rising edge of the internal clock ICLK.

At a time T5, the pre-burst control signal generation circuit 12 of the control signal generation circuit 10 latches the burst information BI in synchronization with the internal clock ICLK and thereby generates the pre-burst control signal B3_PRE at the logic high level.

Because the chip select signal CS is enabled to the logic high level and the logic level combination of the first to seventh command addresses CA<1:7> is the second combination in synchronization with the internal clock ICLK and the inverted internal clock ICLKB, the command decoder 1 generates the read signal ERT at the logic high level.

The core circuit 3 outputs the first to sixteenth internal data ID<1:16> (stored in the first bank group BG1, the second bank group BG2, the third bank group BG3, and the fourth bank group BG4) selected by the first to fourth bank addresses BA<1:4> as the read signal ERT is inputted to the core circuit 3 at the logic high level.

At a time T6, the setting control signal generation circuit 13 of the control signal generation circuit 10 generates the setting control signal SET at the logic high level because the read signal ERT is at the logic high level and the pre-burst control signal B3_PRE is at the logic high level in synchronization with the inverted internal clock ICLKB.

The driving signal generation circuit 21 of the driving circuit 20 generates the driving signal DRV at the logic low level because the setting control signal SET is at the logic high level.

The buffer circuit 22 of the driving circuit 20 generates the burst control signal B3 at a logic high level by inverting and buffering the driving signal DRV.

The data processing circuit 4 outputs the first to sixteenth output data DATA<1:16> by changing the sequence of the bits of the first to sixteenth internal data ID<1:16> through performing the second burst operation according to the burst control signal B3 at the logic high level.

The burst information generation circuit 11 of the control signal generation circuit 10 generates the burst information BI at the logic low level because the operation setting signal CAS is at the logic low level in synchronization with the inverted internal clock ICLKB.

At a time T7, the pre-burst control signal generation circuit 12 of the control signal generation circuit 10 latches the burst information BI in synchronization with the internal clock ICLK and thereby generates the pre-burst control signal B3_PRE at the logic low level.

At a time T8, the logic level combination of the first to seventh command addresses CA<1:7> is inputted as the second combination in synchronization with the rising edge of the internal clock ICLK.

At a time T9, because the chip select signal CS is enabled to the logic high level and the logic level combination of the first to seventh command addresses CA<1:7> is the second combination in synchronization with the internal clock ICLK and the inverted internal clock ICLKB, the command decoder 1 generates the read signal ERT at the logic high level.

The core circuit 3 outputs the first to sixteenth internal data ID<1:16> (stored in the first bank group BG1, the second bank group BG2, the third bank group BG3, and the fourth bank group BG4) selected by the first to fourth bank addresses BA<1:4> as the read signal ERT is inputted to the core circuit 3 at the logic high level.

At a time T10, the setting control signal generation circuit 13 of the control signal generation circuit 10 generates the reset control signal RESET at the logic high level because the read signal ERT is at the logic high level and the pre-burst control signal B3_PRE is at the logic low level in synchronization with the inverted internal clock ICLKB.

The driving signal generation circuit 21 of the driving circuit 20 generates the driving signal DRV at the logic high level because the reset control signal RESET is at the logic high level.

The buffer circuit 22 of the driving circuit 20 generates the burst control signal B3 at a logic low level by inverting and buffering the driving signal DRV.

The data processing circuit 4 outputs the first to sixteenth output data DATA<1:16> without changing the sequence of the bits of the first to sixteenth internal data ID<1:16> through performing the first burst operation according to the burst control signal B3 at the logic low level.

As is apparent from the above descriptions, for a semiconductor device in accordance with the embodiment of the present disclosure, that by setting a burst operation before a read operation and performing the read operation with the set burst operation, an additional time for setting a burst operation may be reduced. Also, for the semiconductor device in accordance with the embodiment of the present disclosure, by setting a burst operation before a read operation and performing the read operation with the set burst operation, because it is not necessary to input an additional command for setting a burst operation, loss in command input efficiency may be reduced or prevented.

Figure 16:
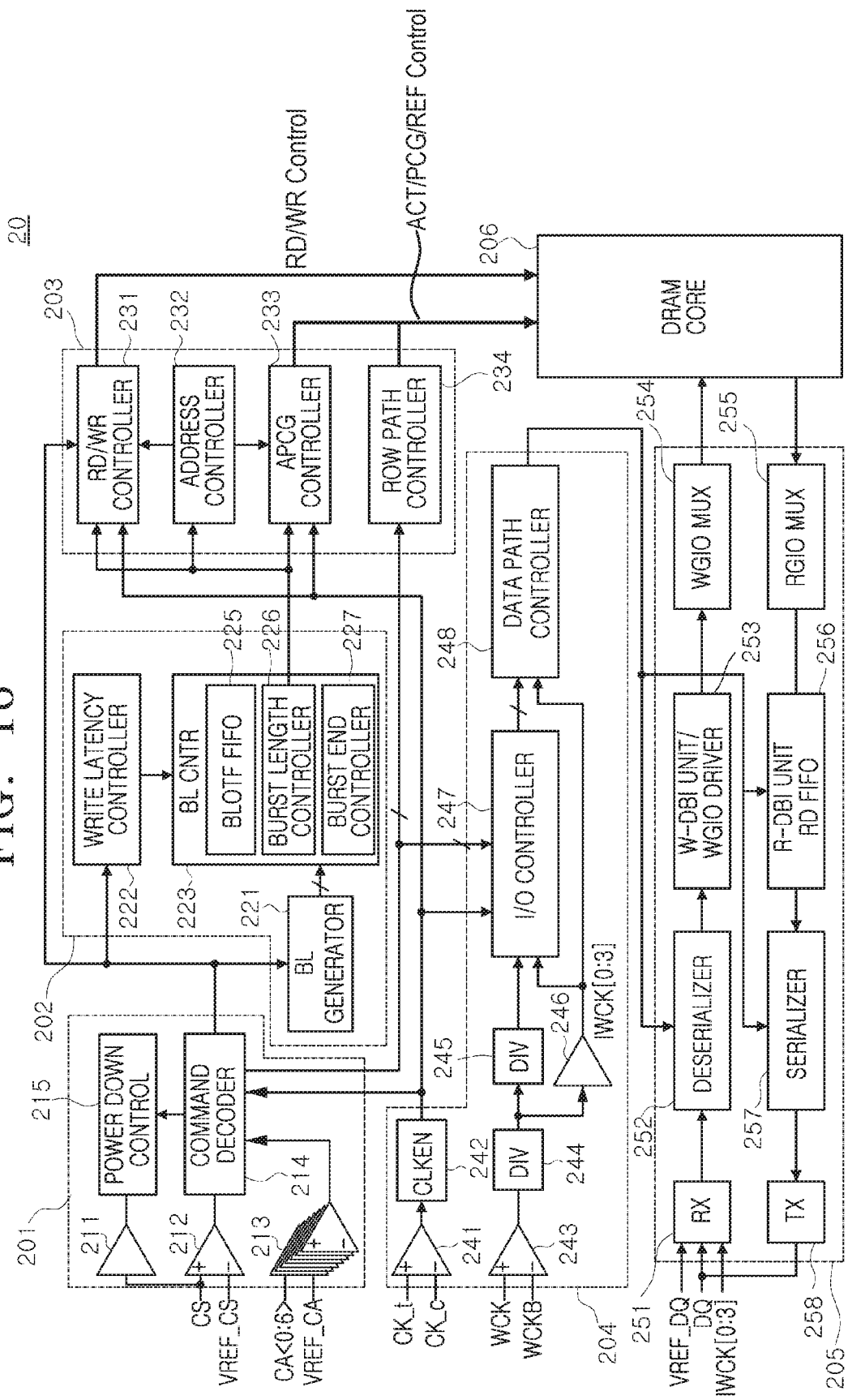
FIG. 16 shows a block diagram illustrating a configuration of another semiconductor device, in accordance with an embodiment.

Referring to FIG. 16, a semiconductor device 20 in accordance with another embodiment may include a command control circuit 201, a latency burst control circuit 202, an operation control circuit 203, an input/output control circuit 204, a data input/output circuit 205, and a DRAM core 206.

The command control circuit 201 may include an input driving circuit 211, a chip select signal buffer 212, a command address buffer 213, a command decoder 214, and a power-down control circuit 215. The input driving circuit 211 may receive and drive a chip select signal CS and transfer it to the power-down control circuit 215. The chip select signal buffer 212 may buffer and receive the chip select signal CS based on a chip select reference voltage VREF_CS. The command address buffer 213 may buffer and receive a command address CA<0:6> based on a command address reference voltage VREF_CA. The command decoder 214 may decode the command address CA<0:6> buffered through the command address buffer 213, based on the chip select signal CS buffered through the chip select signal buffer 212, and may generate various commands necessary for the operation of the semiconductor device 20. The power-down control circuit 215 may control a power-down mode based on the chip select signal CS, which is transferred by being driven through the input driving circuit 211, and a command, which is generated in the command decoder 214.

The latency burst control circuit 202 may include a burst length information generator 221, a write latency controller 222, and a burst length control circuit 223. The burst length information generator 221 may generate informations necessary for controlling a burst length operation based on a command transferred through the command decoder 214. The write latency controller 222 may perform a control operation, depending on a write latency, based on a command transferred through the command decoder 214. The burst length control circuit 223 may include an information storage circuit 225 which stores information transferred from the burst length information generator 221. The burst length control circuit 223 may include a burst length controller 226 for controlling the burst length operation based on a command transferred through the command decoder 214, a signal transferred from the write latency controller 222, and information transferred from the burst length information generator 221. The burst length control circuit 223 may include a burst end controller 227 for controlling a burst end operation based on a command transferred through the command decoder 214, a signal transferred from the write latency controller 222, and information transferred from the burst length information generator 221.

The operation control circuit 203 may include a read/write controller 231, an address controller 232, an auto-precharge controller 233, and a row path controller 234, and may generate a read/write control signal RD/WR Control for controlling a read operation and a write operation and a row path control signal ACT/PCG/REF Control for controlling an active operation, a precharge operation, and a refresh operation. The read/write controller 231 may control the read operation and the write operation based on a signal transferred from the latency burst control circuit 202 and a signal transferred from the address controller 232 when clocks CK_t and CK_c are activated. The address controller 232 may control address generation based on a signal transferred from the latency burst control circuit 202. The auto-precharge controller 233 may control an auto-precharge operation based on a signal transferred from the latency burst control circuit 202 when the clocks CK_t and CK_c are activated. The row path controller 234 may control a row path based on a command transferred through the command decoder 214.

The input/output control circuit 204 may include a first clock buffer 241, a clock enable signal generator 242, a second clock buffer 243, a first divider 244, a second divider 245, an internal clock driver 246, an input/output controller 247, and a data path controller 248. The first clock buffer 241 may buffer and receive the clocks CK_t and CK_c. The clock enable signal generator 242 may generate a clock enable signal after the clocks CK_t and CK_c buffered and received through the first clock buffer 241 are activated. The second clock buffer 243 may buffer and receive data clocks WCK and WCKB for data input/output. The first divider 244 may divide the data clocks WCK and WCKB which are buffered and received through the second clock buffer 243. The second divider 245 may receive and divide a clock divided through the first divider 244. The internal clock driver 246 may receive and divide the clock divided through the first divider 244, and may generate an internal data dock IWCK[0:3]. The input/output controller 247 may control data input/output by receiving a dock divided through the second divider 245 and the internal data dock IWCK[0:3]. The data path controller 248 may control a data path to be used in data input/output, based on a signal transferred through the input/output controller 247 and the internal data clock IWCK[0:3].

The data input/output circuit 205 may include a receiver 251, a deserializer 252, a write driver 253, a write multiplexer 254, a read multiplexer 255, a read driver 256, a serializer 257, and a transmitter 258. The receiver 251 may receive transmission data DQ based on a data reference voltage VREF_DQ in synchronization with the internal data clock IWCK[0:3]. The deserializer 252 may convert the transmission data DQ received in series through the receiver 251, into parallel data. The write driver 253 may drive the parallel-converted data and transfer it to the write multiplexer 254. The write multiplexer 254 may load the data driven through the write driver 253, on an input/output line through multiplexing, and may transfer the loaded data to the DRAM core 206. The read multiplexer 255 may multiplex and output data outputted through an input/output line from the DRAM core 206 in the read operation. The read driver 256 may drive and output data transferred through the read multiplexer 255, to the serializer 257. The serializer 257 may convert the data, driven through the read driver 256 and received in parallel, into serial data. The transmitter 258 may transmit the data serial-converted by the serializer 257, as transmission data DQ.

The DRAM core 206 may perform the read operation and the write operation of inputting and outputting data through the data input/output circuit 205, based on the read/write control signal RD/WR Control. The DRAM core 206 may perform the active operation, the precharge operation, and the refresh operation based on the row path control signal ACT/PCG/REF Control.

While a limited number of possible embodiments have been described above, it will be understood by those skilled in the art that the described embodiments serve as examples only and are not intended to be exhaustive. Accordingly, the semiconductor device described herein should not be limited based on the described embodiments.

What is claimed is:
1. A semiconductor device comprising:
a burst control circuit configured to generate burst information depending on a logic level of a setting bit when an operation setting signal is inputted, and configured to generate a burst control signal from the burst information when a read signal is inputted; and
a data processing circuit configured to output output data by performing first and second burst operations for internal data, depending on a logic level of the burst control signal,
wherein the burst control circuit comprises:
a control signal generation circuit configured to latch the operation setting signal and the setting bit in synchronization with an internal clock and an inverted internal clock, and configured to generate a setting control signal and a reset control signal from the latched operation setting signal and the setting bit when the read signal is inputted; and
a driving circuit configured to generate the burst control signal for which an enable period is set depending on the setting control signal and the reset control signal.

2. The semiconductor device according to claim 1, wherein the operation setting signal is enabled to enter a setting mode for setting the first and second burst operations.

3. The semiconductor device according to claim 1, wherein the read signal is generated after one cycle period of an internal clock from a time when the operation setting signal is generated.

4. The semiconductor device according to claim 1, wherein the setting bit is generated from a command address of command addresses inputted in synchronization with an inverted internal clock.

5. The semiconductor device according to claim 1, wherein the first burst operation is an operation of outputting the output data without changing a sequence of a plurality of bits included in the internal data, and wherein the second burst operation is an operation of outputting the output data by changing the sequence of the plurality of bits included in the internal data.

6. The semiconductor device according to claim 1, wherein the control signal generation circuit comprises:
a burst information generation circuit configured to generate the burst information from the setting bit when the operation setting signal is enabled in synchronization with the inverted internal clock;
a pre-burst control signal generation circuit configured to generate a pre-burst control signal by latching the burst information in synchronization with the internal clock;
a setting control signal generation circuit configured to generate the setting control signal from the pre-burst control signal when the read signal is enabled in synchronization with the inverted internal clock; and
a reset control signal generation circuit configured to generate the reset control signal from the pre-burst control signal when the read signal is enabled in synchronization with the inverted internal clock.

7. The semiconductor device according to claim 6, wherein the reset control signal is enabled after two cycles of the inverted internal clock after the setting control signal is enabled.

8. The semiconductor device according to claim 1, wherein the driving circuit comprises:
a driving signal generation circuit configured to generate a driving signal depending on logic levels of the setting control signal and the reset control signal; and
a buffer circuit configured to latch the driving signal, and configured to output the burst control signal by inverting and buffering the latched driving signal.

9. The semiconductor device according to claim 1, wherein the data processing circuit comprises:
a select signal generation circuit configured to generate a select signal from the burst control signal when the read signal is inputted in synchronization with an internal clock;
a data alignment circuit configured to latch the internal data in synchronization with the internal clock when the read signal is inputted, and configured to generate aligned data and converted data from the internal data in synchronization with a control clock;
a selected data generation circuit configured to output one of the aligned data and the converted data as selected data depending on the select signal; and
a data output circuit configured to output the selected data as the output data in synchronization with the control clock.

10. The semiconductor device according to claim 9, wherein the select signal generation circuit comprises:
a burst input control signal generation circuit configured to generate a burst input control signal from the read signal in synchronization with the internal clock;
a burst output control signal generation circuit configured to generate a burst output control signal by shifting the read signal by a preset number of times by which the internal clock toggles; and
a burst latch circuit configured to latch the burst control signal when the burst input control signal is inputted, and configured to output the latched burst control signal as the select signal when the burst output control signal is inputted.

11. The semiconductor device according to claim 9, wherein the data alignment circuit comprises:
a read input control signal generation circuit configured to generate a read input control signal from the read signal in synchronization with the internal clock;
a read output control signal generation circuit configured to shift the read signal in synchronization with the internal clock, and configured to generate a read output control signal from the shifted read signal in synchronization with the control clock; and
a read latch circuit configured to latch the internal data when the read input control signal is inputted, and configured to output the latched internal data as the aligned data and as the converted data by changing a sequence of the internal data, depending on the read output control signal.

12. A semiconductor device comprising:
a command decoder configured to generate an operation setting signal and then generate a read signal depending on a combination of command addresses in synchronization with an internal clock and an inverted internal clock;
a burst control circuit configured to generate a burst control signal from a setting bit depending on the operation setting signal and the read signal; and
a data processing circuit configured to output output data by performing first and second burst operations for internal data, depending on a logic level of the burst control signal,
wherein the burst control circuit comprises:
a control signal generation circuit configured to latch the operation setting signal and the setting bit in synchronization with the internal clock and the inverted internal clock, and configured to generate a setting control signal and a reset control signal from the latched operation setting signal and the setting bit when the read signal is inputted; and
a driving circuit configured to generate the burst control signal for which an enable period is set depending on the setting control signal and the reset control signal.

13. The semiconductor device according to claim 12, wherein the operation setting signal is enabled when the combination of the command addresses is a first logic level combination in synchronization with the internal clock, and wherein the read signal is enabled when the combination of the command addresses is a second logic level combination in synchronization with the internal clock.

14. The semiconductor device according to claim 12, wherein the operation setting signal is enabled to enter a setting mode for setting the first and second burst operations.

15. The semiconductor device according to claim 12, wherein the read signal is generated after one cycle period of the internal clock from a time when the operation setting signal is generated.

16. The semiconductor device according to claim 12, wherein the setting bit is generated from a command address of the command addresses inputted in synchronization with the inverted internal clock.

17. The semiconductor device according to claim 12, wherein the first burst operation is an operation of outputting the output data without changing a sequence of a plurality of bits included in the internal data, and wherein the second burst operation is an operation of outputting the output data by changing the sequence of the plurality of bits included in the internal data.

18. The semiconductor device according to claim 12, wherein the control signal generation circuit comprises:
a burst information generation circuit configured to generate the burst information from the setting bit when the operation setting signal is enabled in synchronization with the inverted internal clock;
a pre-burst control signal generation circuit configured to generate a pre-burst control signal by latching the burst information in synchronization with the internal clock;
a setting control signal generation circuit configured to generate the setting control signal from the pre-burst control signal when the read signal is enabled in synchronization with the inverted internal clock; and
a reset control signal generation circuit configured to generate the reset control signal from the pre-burst control signal when the read signal is enabled in synchronization with the inverted internal clock.

19. The semiconductor device according to claim 18, wherein the reset control signal is enabled after two cycles of the inverted internal clock after the setting control signal is enabled.

20. The semiconductor device according to claim 12, wherein the driving circuit comprises:

a driving signal generation circuit configured to generate a driving signal depending on logic levels of the setting control signal and the reset control signal; and a buffer circuit configured to latch the driving signal, and configured to output the burst control signal by inverting and buffering the latched driving signal.

21. The semiconductor device according to claim 12, wherein the data processing circuit comprises:

a select signal generation circuit configured to generate a select signal from the burst control signal when the read signal is inputted in synchronization with the internal clock;

a data alignment circuit configured to latch the internal data in synchronization with the internal clock when the read signal is inputted, and configured to generate aligned data and converted data from the internal data in synchronization with a control clock;

a selected data generation circuit configured to output one of the aligned data and the converted data as selected data depending on the select signal; and a data output circuit configured to output the selected data as the output data in synchronization with the control clock.

22. The semiconductor device according to claim 21, wherein the select signal generation circuit comprises:

a burst input control signal generation circuit configured to generate a burst input control signal from the read signal in synchronization with the internal clock;

a burst output control signal generation circuit configured to generate a burst output control signal by shifting the read signal by a preset number of times by which the internal clock toggles; and a burst latch circuit configured to latch the burst control signal when the burst input control signal is inputted, and configured to output the latched burst control signal as the select signal when the burst output control signal is inputted.

23. The semiconductor device according to claim 21, wherein the data alignment circuit comprises:

a read input control signal generation circuit configured to generate a read input control signal from the read signal in synchronization with the internal clock;

a read output control signal generation circuit configured to shift the read signal in synchronization with the internal clock, and configured to generate a read output control signal from the shifted read signal in synchronization with the control clock; and a read latch circuit configured to latch the internal data when the read input control signal is inputted, and configured to output the latched internal data as the aligned data and as the converted data by changing a sequence of the internal data, depending on the read output control signal.

* * * * *